US006757122B1

(12) United States Patent
Kuznetsov et al.

(10) Patent No.: US 6,757,122 B1
(45) Date of Patent: Jun. 29, 2004

(54) METHOD AND DECODING APPARATUS USING LINEAR CODE WITH PARITY CHECK MATRICES COMPOSED FROM CIRCULANTS

(75) Inventors: Alexander Vasilievich Kuznetsov, Pittsburgh, PA (US); Bane Vasic, Tucson, AZ (US); Erozan Mehmet Kurtas, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/160,699

(22) Filed: May 30, 2002

Related U.S. Application Data

(60) Provisional application No. 60/352,612, filed on Jan. 29, 2002.

(51) Int. Cl.$^7$ ................................................. G11B 5/09
(52) U.S. Cl. ........................... 360/53; 360/46; 714/794; 714/795; 375/262
(58) Field of Search .............................. 360/46, 65, 51, 360/53; 375/262, 265, 240.27; 714/786, 794, 795, 800

(56) References Cited

U.S. PATENT DOCUMENTS 6,185,716 B1 * 2/2001 Riggle ........................ 714/769

OTHER PUBLICATIONS

Fan et al., Sep. 22–24, 1999, University of Illinois, "Thirty-Seventh Annual Allerton Conference on Communication, Control and Computing", pp. 1315–1318.*
Z. Wu, "Coding and Iterative Detection for Magnetic Recording Channels," The Kluwer International Series in Engineering and Computer Science, Chapter 3, pp. 47–65, Jan. 2000.

Y. Kou, S. Lin, and M. Fossorier, "Low–Density Parity–Check Codes Based on Finite Geometries: A Rediscovery and New Results," IEEE Transactions on Information Theory, vol. 47, No. 7, pp. 2711–2736, Nov. 2001.

R. G. Gallager, "Low–Density Parity–Check Codes," Cambridge, Massachusetts, MIT Press, Jul. 1963.

B. Vasic, "Structured Iteratively Decodable Codes Based on Steiner Systems and Their Application in Magnetic Recording," Globecom 2001, San Antonio, Texas, Nov. 2001.

J. Hagenauer and P. Hoeher, "A Viterbi Alorithm with Soft–Decision Outputs and its Applications," Dallas GLOBECOM '89, pp. 1680–1686, Nov. 27–30, 1989.

L. R. Bahl, J. Cocke, F. Jelinek, and J. Raviv, "Optimal Decoding of Linear Codes for Minimizing Symbol Error Rate," IEEE Transactions on Information Theory, vol. IT–20, No. 2, pp. 284–287, Mar. 1974.

J. L. Fan, A. Friedmann, E. Kurtas, and S. McLaughlin, "Low Density Parity Check Codes for Magnetic Recoding," Thrity–seventh Annual Allerton Conference on Communication, Control and Computing, Monticello, Illinois, pp. 1314–1323, Sep. 22–24, 1999.

(List continued on next page.)

Primary Examiner—David Hudspeth
Assistant Examiner—Glenda P. Rodriguez
(74) Attorney, Agent, or Firm—Westman, Champlin & Kelly, P.A.

(57) ABSTRACT

The present invention provides a novel method and apparatus for decoding digital information transmitted through the communication channel or recorded on a recording medium. The method and apparatus are preferably applied in the systems where data is encoded using regular LDPC codes with parity check matrices composed from circulants (a matrix is called a circulant if all its column or row are cyclic shifts each other).

20 Claims, 12 Drawing Sheets

OTHER PUBLICATIONS

D. J. C. MacKay, "Good Error–Correcting Codes Based on Very Sparse Matrices," IEEE Transactions on Information Theory, vol. 45, No. 2, pp. 399–431, Mar. 1999.

T. Richardson, A. Shokrollahi, and R. Urbanke, "Design of Provably Good Low–Density Parity Check Codes," 2000 IEEE International Symposium on Information Theory, pp. 199, Jun. 25–30, 2000.

R. M. Tanner, "Recursive Approach to Low Complexity Codes," IEEE Transactions on Information Theory, vol. IT–27, No. 5, pp. 533–547, Sep. 1981.

Fan, J. L. "Constrained Coding and Soft Iterative Decoding", Proceedings of the IEEE Information Theory Workshop 2001, Sep. 2, 2001, pp. 18–20.

Soljanin, E. "Simple Soft–Output Detection for magnetic Recording Channels", Proceedings of the 2000 IEEE International Symposium on Information Theory ISIT 2000, Sorrento, Italy, Jun. 25–30, 2000, IEEE International Symposium on Information Theory, New York, NY, Jun. 25, 2000, p. 257.

\* cited by examiner

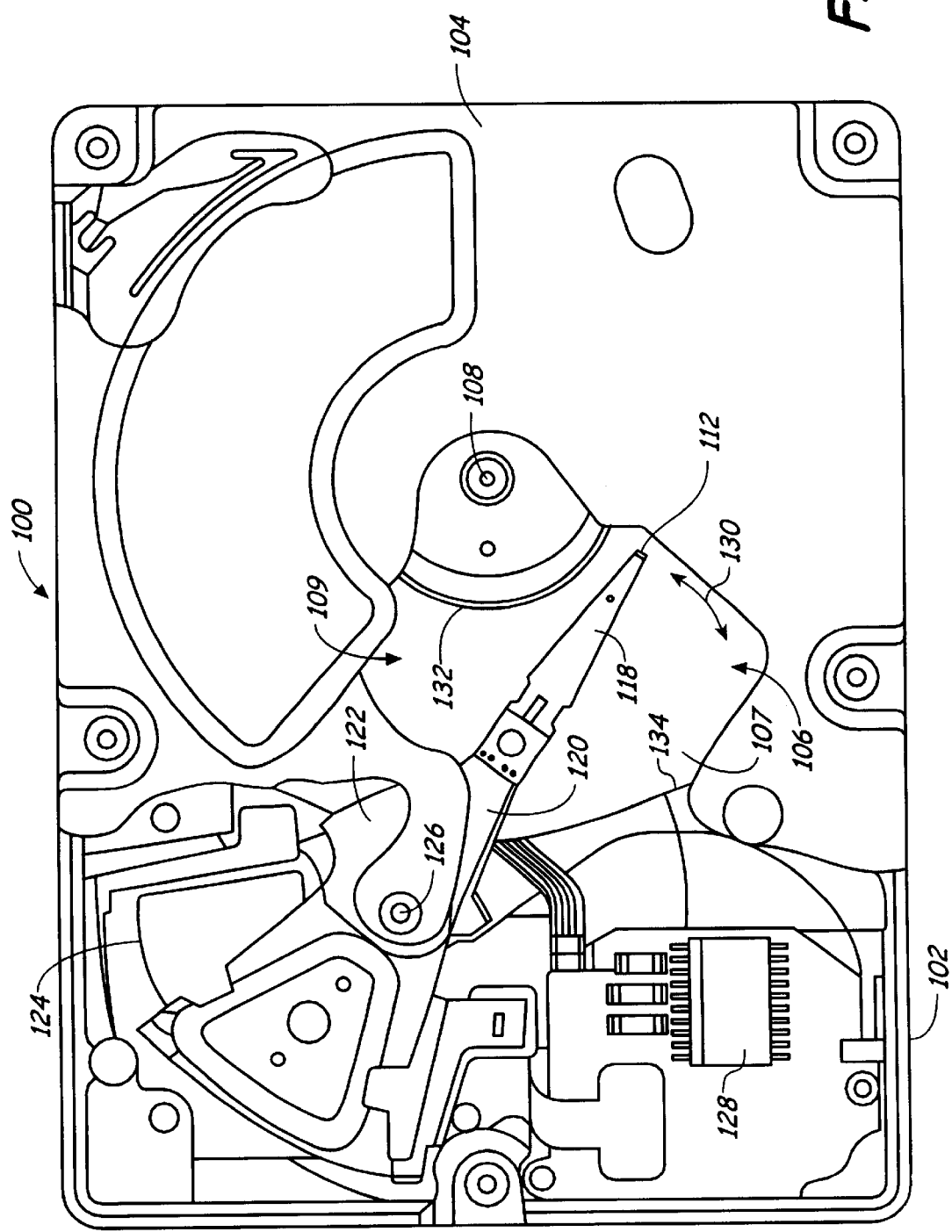
FIG_1

METHOD AND DECODING APPARATUS USING LINEAR CODE WITH PARITY CHECK MATRICES COMPOSED FROM CIRCULANTS

CROSS-REFERENCE TO RELATED APPLICATION

This application claims priority from U.S. Provisional Application 60/352,612 filed on Jan. 29, 2002 for inventors Alexander V. Kuznetsov, Bane Vasic and Erozan Kurtas and entitled A METHOD AND DECODING APPARATUS USING LINEAR CODES WITH PARITY CHECK MATRICES COMPOSED FROM CIRCULANTS, which is herein incorporated by reference.

FIELD OF THE INVENTION

The invention relates generally to data storage and/or communication systems. More particularly, the invention relates to the iterative soft and hard decoding of linear codes defined by the parity check matrices composed from sub-matrices with a cyclic property (circulants).

BACKGROUND OF THE INVENTION

Recently, various types of turbo codes have been proposed for communication channels and storage systems. Combined with a BCJR (Bahl, Cocke, Jelinek and Raviv) algorithm or a Soft-Output Viterbi Algorithm (SOVA) those codes provide flexible tradeoffs in complexity and Bit Error Rate (BER). But due to the high latency of the decoding process, turbo codes are inappropriate for extremely high speed communication and high-density magnetic recording applications.

Similar BER characteristics at the lower level of complexity can be also achieved by the use of the Gallager Low Density Parity Check (LDPC) codes defined by a parity check matrix with some small fixed number of ones in each column. Originally, the LDPC codes have been constructed by random choice of the parity check matrix, but such codes require very complex encoders and decoders in general. Despite tremendous progress in achieving BER characteristics using LDPC codes, the problems of implementation complexity were left aside until the current time. A significant insight into the nature of iterative decoding has been gained due to interpretation of the decoding algorithms in terms of belief propagation in graphical models, but these graphical models of message passing are used mainly for the illustrative purposes, and the complexity factors still dominate system architecture and design considerations, especially in extremely high speed applications such as magnetic recording. The high complexity of the existing schemes is a direct consequence of the fact that parity check matrices of the random LDPC codes do not have a regular structure, and therefore large amounts of memory and logic gates are required to build corresponding encoders and decoders.

The results of several studies of LDPC based communication and storage systems have been recently reported and several schemes based on random regular and irregular LDPC codes have been described. The irregular LDPCs have parity check matrices with multiple column weights and linearly dependant rows (deficient rank parity check matrix). These codes enable faster encoding since the dimension of the systematic form of the parity check matrix used to calculate parity bits turns out to be much smaller than the number of parity check equations used in decoding. However, the parity check matrix of an irregular code is still similar to the random structure of a Gallager LDPC. Another approach is the algebraic construction of LDPC codes using finite geometries. The finite geometry LDPC codes are quasi-cyclic and their encoders can be implemented using linear shift registers with feedback connections defined by the generator polynomial of the code. The resulting codes have been demonstrated to have excellent performance in AWGN, although their rates are still low for high data rate applications, and decoder complexities are somewhat high.

A class of structured high rate LDPC codes with orthogonal parities has been constructed from Kirkman triple systems. Both finite geometries and Kirkman systems are special classes of the Balanced Incomplete Block Designs (BIBD). Although many different types of the BIBD are described in the mathematical literature, not many of them give LDPC codes with high rates and sufficiently large minimum Hamming distances.

Therefore, the complexity issues remain to be the dominant factor that prevent the wide use of the LDPC based architectures, especially in extremely high speed applications such as magnetic recording. The high complexity of the existing schemes is a direct consequence of the fact that parity check matrices of the random LDPC codes do not have a regular structure, and therefore large amounts of memory and logic gates are required to build corresponding encoders and decoders. A proposed method of overcoming the problems of implementation complexity would be a significant improvement in the art.

SUMMARY OF THE INVENTION

The present invention provides a novel method and apparatus for decoding digital information transmitted through the communication channel or recorded on a recording medium. In some embodiments of the invention, the method and apparatus are applied in the systems where data is encoded using structured LDPC codes with parity check matrices composed from circulants (a matrix is called a circulant if all its columns or rows are cyclic shifts of each other). A class of such codes is constructed from integer lattices, and described later. A more complete understanding of the present invention, as well as other features and advantages of the present invention, may be obtained with reference to the following detailed description and accompanying drawings.

Other features and benefits that characterize embodiments of the present invention will be apparent upon reading the following detailed description and review of the associated drawings.

BRIEF DESCRIPTION OF THE DRAWINGS

FIG. 1 is a plan view of a disc drive in accordance with embodiments of the present invention.

FIGS. 5, 6-1, 6-2, 7 and 8 are block diagrams illustrating in greater detail portions of the LDPC decoder shown in FIG. 4, in accordance with various alternate embodiments.

DETAILED DESCRIPTION OF ILLUSTRATIVE EMBODIMENTS

The present invention discloses a new efficient decoding technique for the LDPC codes constructed mainly from the BIBD's. A new wide class of such LDPC codes is described in this application using the notion of an integer lattice. As seen below, these codes have very well structured parity check matrices that are suitable for the efficient implementation of encoding and decoding circuits.

Figures 1, 6:
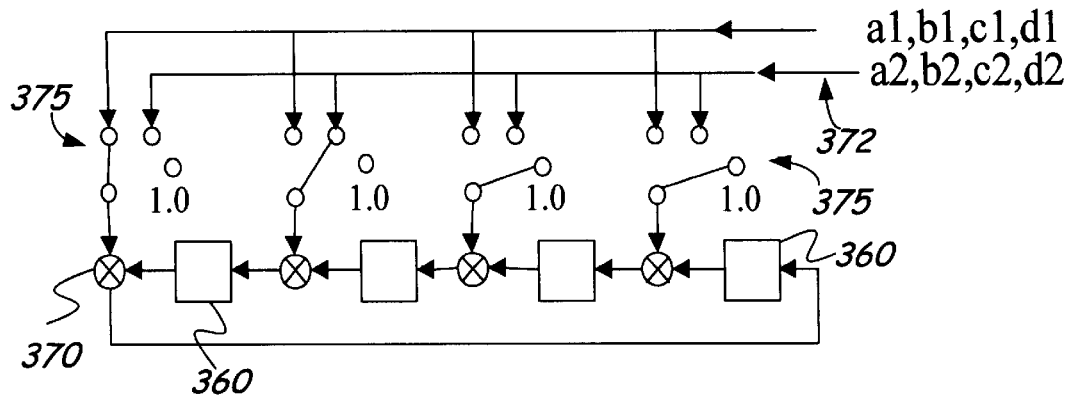
Figures 2, 6:
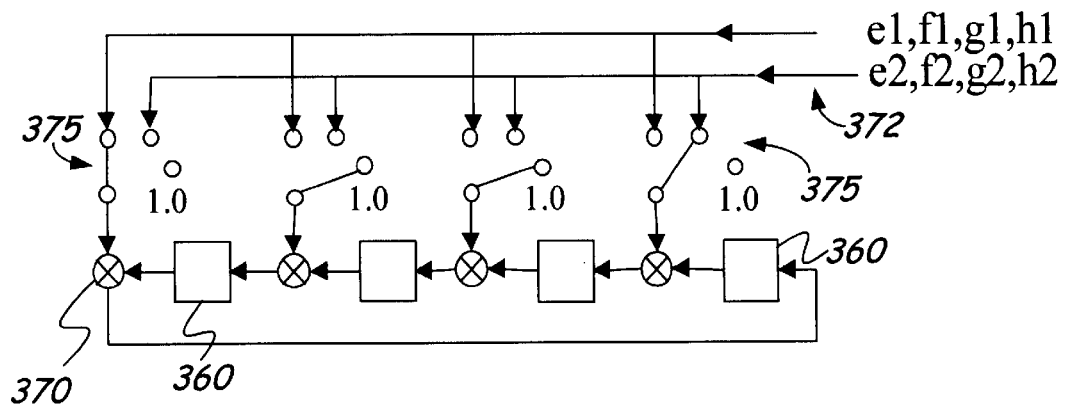

FIG. 1 is a plan view of a disc drive 100 which includes a housing with a base 102 and a top cover 104 (sections of top cover 104 are removed for clarity). Disc drive 100 further includes a disc pack 106, which is mounted on a spindle motor (not shown). Disc pack 106 includes a plurality of individual discs 107, which are mounted for co-rotation about central axis 108. Each disc 107 has an associated product head 112 which carries one or more read and write transducers (read and write heads) for communicating with disc surface 109. Each product head 112 is supported by a suspension 118 which is in turn attached to a track accessing arm 120 of an actuator assembly 122. Actuator assembly 122 is rotated about a shaft 126 by a voice coil motor 124, which is controlled by servo control circuitry, to move head 112 in an arcuate path 130 between a disc inner diameter 132 and a disc outer diameter 134.

Also shown in FIG. 1 is circuitry 128 which diagrammatically represents circuitry associated with the channel architecture used in processing signals to be written to or read from the disc or media surface. The position in which circuitry 128 is located need not be as shown in FIG. 1, but instead, the position of circuitry 128 shown in FIG. 1 is provided as an example for discussion purposes. Further, disc drive 100 is intended to represent any of a variety of data storage devices in which the methods and apparatus of the present invention can be implemented. In other embodiments, disc drive 100 can be other types of magnetic disc drive, or can be other types of disc drive such as an optical disc drive, a magneto-optical disc drive, etc. The methods and apparatus disclosed herein can also be used in other data storage devices, for example in magnetic tape storage devices. Further still, the methods and apparatus of the present invention can be used in environments other than data storage systems. For instance, the methods and apparatus of the present invention can also be used in communication systems. The following discussion, though directed specifically to data storage systems at times, is intended to be applicable to all such uses of the present invention, and disc drive 100 is intended to represent but one type of communication system in which the present invention can be practiced.

Figure 2:
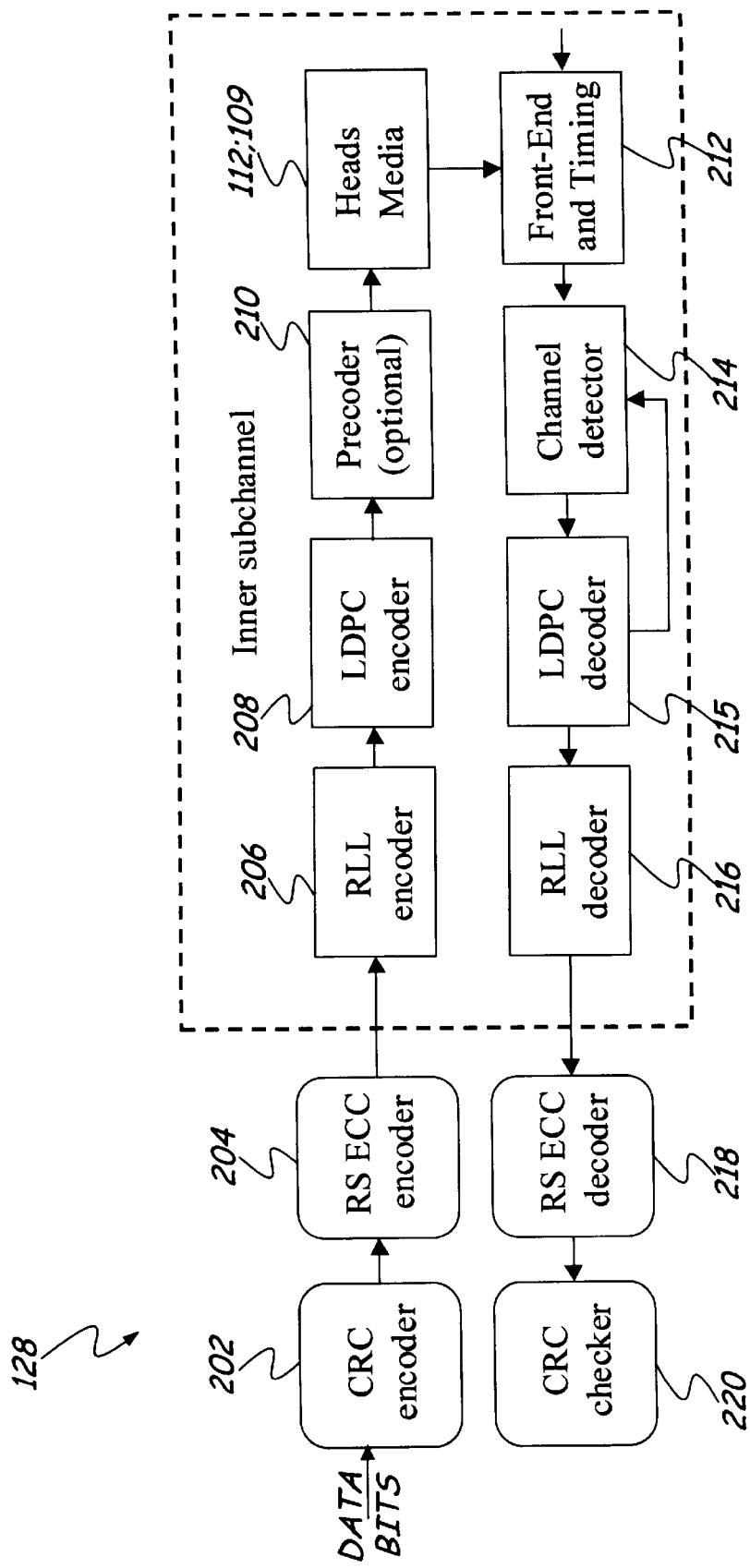
FIG. 2 is a block diagram illustrating a read channel architecture in which the embodiments of the LDPC decoder of the present invention can be implemented.

FIG. 2 is a block diagram illustrating circuitry 128 used to implement the channel architecture in some embodiments of the invention in which a data head interacts with a recording media, for example in disc drives or other data storage systems. Although shown in FIG. 2 in the context of a data storage system, the low density parity check code generating systems and methods of the present invention are not limited to use in data storage apparatus, but instead can be used in other environments such as in communications systems.

As shown in FIG. 2, the channel architecture can include a number of different encoding/decoding circuits, each encoding or decoding data in different manners for different purposes. The various circuits shown in the blocks of FIG. 2 can be implemented as integrated circuits, discrete components, or suitably programmed processing circuitry. For discussion purposes, various blocks shown in FIG. 2 are referred to generically as being circuitry.

As shown in FIG. 2, data bits of a message word to be recorded on the recording media 109 are provided to cyclic redundancy check (CRC) encoder circuit 202 and then to RS error correcting code (ECC) circuit 204. Cyclic redundancy check encoder circuit 202 encodes the data using coding techniques of the type which are well known in the art in order to minimize mis-correction of errors in the decoding process. Error correcting code circuit 204 introduces additional bits to the message data bits. The additional bits improve the ability of the system to recover the signal when the encoded signal has been corrupted by noise introduced by the recording channel. The order of CRC encoder circuit 202 and ECC encoder circuit 204 is not limited to the specific arrangement illustrated in FIG. 2. Also, circuitry 128 shown in FIG. 2 includes a RS ECC decoder circuit 218 and a CRC checker circuit 220 in order to decode and CRC check data read back from the media using heads 112.

Within the inner sub-channel are run length limited (RLL) encoder 206 and decoder 216, which are of the type well known in the art. Run length limited encoder 206 can, in other embodiments, be implemented before RS ECC encoder if desired. Similar repositioning of RLL decoder 216 would also occur in these other embodiments. Low density parity check encoder circuitry 208 encodes the data with LDPC codes having particular characteristics, which are discussed below in greater detail.

Precoder circuit 210 is optionally included in the inner sub-channel and can be used to implement a code of rate 1/1. Generally, precoder circuit 210 is used to eliminate catastrophic error events and/or to convert the data from binary to another format. Front-end and timing circuit 212 filters and converts an analog read back signal from the head into a digital signal, providing timing for sampling of the read back signal. Channel detector 214 and LDPC decoder 215 function together as described below to convert the digital signal into a binary (i.e., 1's and 0's) signal. While read/write channels of magnetic and/or optical disk drives are primary targets of the present invention, the present invention relates mainly to LDPC decoder 215.

1. Structure of the Parity Check Matrices Used in the Invention

A circulant is a matrix whose column (rows) are cyclic shifts of its first column (row). In this invention, we consider communication or storage systems where data are encoded using linear codes with the parity check matrices in the form described in Equation (1):

$$H = \begin{bmatrix} H_{1,1} & H_{1,2} & \ldots & H_{1,t} \\ H_{2,1} & H_{2,2} & \ldots & H_{2,t} \\ \ldots & \ldots & \ldots & \ldots \\ H_{a,1} & H_{a,2} & \ldots & H_{a,t} \end{bmatrix} \quad (1)$$

where all sub-matrices $H_{i,j}$, $1 \leq i \leq a$, $1 \leq j \leq t$ are m×m circulants. In the Appendix at the end of this disclosure, we describe a wide class of LDPC codes with such parity check matrices constructed from circulants with the column weight b=1. The following notations for code parameters are used below:

- a is the number of circulants, $H_{i,j}$, in one column of Equation (1);
- t is the number of circulants, $H_{i,j}$, in one row of equation (1);
- m is the number of rows and columns in one circulants $H_{i,j}$;
- b is the number of ones in one column (row) of the circulants, $H_{i,j}$;
- k=a·b is the column weight of a parity check matrix H;
- M=m·a is the total number of the parity checks; and
- N=m·t is the length of the code.

For illustrative purposes we will use the following parity check matrix of the lattice LDPC code of length N=25 with 10 information bits and 15 parity bits (a=3, b=1, t=m=5):

$$H = \begin{bmatrix} \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} \\ \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix} & \begin{bmatrix} 0 & 0 & 0 & 1 & 0 \\ 0 & 0 & 0 & 0 & 1 \\ 1 & 0 & 0 & 0 & 0 \\ 0 & 1 & 0 & 0 & 0 \\ 0 & 0 & 1 & 0 & 0 \end{bmatrix} & \begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix} & \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} \\ \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} & \begin{bmatrix} 0 & 0 & 0 & 1 & 0 \\ 0 & 0 & 0 & 0 & 1 \\ 1 & 0 & 0 & 0 & 0 \\ 0 & 1 & 0 & 0 & 0 \\ 0 & 0 & 1 & 0 & 0 \end{bmatrix} & \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} & \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix} & \begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix} \end{bmatrix} \quad (2)$$

Another wide class of efficient LDPC codes can be constructed using Kirkman and Steiner systems. For these codes a=1, and the parity check matrix of Equation (1) has only one strip of circulants. An example of such a parity check matrix used later for illustrative purposes is given below in Equation (3).

$$H = \begin{bmatrix} \begin{bmatrix} 1 & 0 & 0 & 0 & 0 & 0 & 0 & 0 & 1 & 0 & 0 & 1 \\ 1 & 1 & 0 & 0 & 0 & 0 & 0 & 0 & 0 & 1 & 0 & 0 \\ 0 & 1 & 1 & 0 & 0 & 0 & 0 & 0 & 0 & 0 & 1 & 0 \\ 0 & 0 & 1 & 1 & 0 & 0 & 0 & 0 & 0 & 0 & 0 & 1 \\ 1 & 0 & 0 & 1 & 1 & 0 & 0 & 0 & 0 & 0 & 0 & 0 \\ 0 & 1 & 0 & 0 & 1 & 1 & 0 & 0 & 0 & 0 & 0 & 0 \\ 0 & 0 & 1 & 0 & 0 & 1 & 1 & 0 & 0 & 0 & 0 & 0 \\ 0 & 0 & 0 & 1 & 0 & 0 & 1 & 1 & 0 & 0 & 0 & 0 \\ 0 & 0 & 0 & 0 & 1 & 0 & 0 & 1 & 1 & 0 & 0 & 0 \\ 0 & 0 & 0 & 0 & 0 & 1 & 0 & 0 & 1 & 1 & 0 & 0 \\ 0 & 0 & 0 & 0 & 0 & 0 & 1 & 0 & 0 & 1 & 1 & 0 \\ 0 & 0 & 0 & 0 & 0 & 0 & 0 & 1 & 0 & 0 & 1 & 1 \end{bmatrix} & \begin{bmatrix} 1 & 0 & 0 & 0 & 0 & 0 & 1 & 0 & 0 & 0 & 1 & 0 \\ 0 & 1 & 0 & 0 & 0 & 0 & 0 & 1 & 0 & 0 & 0 & 1 \\ 1 & 0 & 1 & 0 & 0 & 0 & 0 & 0 & 1 & 0 & 0 & 0 \\ 0 & 1 & 0 & 1 & 0 & 0 & 0 & 0 & 0 & 1 & 0 & 0 \\ 0 & 0 & 1 & 0 & 1 & 0 & 0 & 0 & 0 & 0 & 1 & 0 \\ 0 & 0 & 0 & 1 & 0 & 1 & 0 & 0 & 0 & 0 & 0 & 1 \\ 0 & 0 & 0 & 0 & 1 & 0 & 1 & 0 & 0 & 0 & 0 & 0 \\ 1 & 0 & 0 & 0 & 0 & 1 & 0 & 1 & 0 & 0 & 0 & 0 \\ 0 & 1 & 0 & 0 & 0 & 0 & 1 & 0 & 1 & 0 & 0 & 0 \\ 0 & 0 & 1 & 0 & 0 & 0 & 0 & 1 & 0 & 1 & 0 & 0 \\ 0 & 0 & 0 & 1 & 0 & 0 & 0 & 0 & 1 & 0 & 1 & 0 \\ 0 & 0 & 0 & 0 & 1 & 0 & 0 & 0 & 0 & 1 & 0 & 1 \end{bmatrix} \end{bmatrix} \quad (3)$$

In this example, a=1, b=3 and therefore the column weight of H is equal k=ab=3. This parity check matrix is constructed from the (26,3,1) Kirkman system.

In general, other types of the BIBD can also give parity check matrices of the form shown in Equation (1) with different values of the parameters a, b, t and m. The fact that submatrices $H_{i,j}$ in Equation (1) have a circular property can significantly simplify the hardware implementation of the encoder and decoder circuits.

2. Description of the Decoding Method

As described above, FIG. 2 is a block diagram illustrating different steps of encoding and decoding of data in a disc drive or other data storage system using LDPC codes. Although in FIG. 2 the LDPC encoder and decoder are considered in the context of a data storage system, the present invention is not limited to be used in data storage, but also can be used in other environments, in particular, in communications systems. As shown in FIG. 2, the complete channel architecture can include different encoding/decoding circuits used for different purposes and sometimes performed in different order. For example, the RLL encoder can be located before the RS encoder (reverse RLL-ECC scheme). The precoder is optional, and used to eliminate catastrophic error events and/or to convert the data from NRZ (Non-Return-to-Zero) to NRZI (Non-Return-to-Zero Inverse) formats or vise versa. Front-end and timing circuits convert an analog read back signal from the head into a digital signal processed by detection scheme.

Outer decoding iteration. In FIG. 2 the detection scheme consists of a cascade of a channel detector 214 and an LDPC decoder 215. The channel detector can use Soft Output Viterbi Algorithm (SOVA), Bahl-Cocke-Jelinek-Raviv (BCJR) algorithm, or other types of algorithms that can provide so called log-likelihood ratios $\lambda(i) = \log(p_i/(1-p_i))$, where $p_i$ is the probability that the transmitted bit $u_i$ of the code word is equal to 1 ($1 \leq i \leq N$). These log-likelihood ratios $\lambda(i)$ are used by the LDPC decoder 215 as inputs to get "improved" soft decisions regarding transmitted data.

An input of the LDPC decoder 215 is a vector of real numbers $\lambda = (\lambda(1), \lambda(2), \ldots, \lambda(N))$ generated by the channel detector 214, and the output is the vector of corrected log-likelihood ratios $\lambda' = (\lambda(1)', \lambda(2)', \ldots, \lambda(N)')$. This process is often called updating log-likelihood ratios, and involves the calculation of a vector of "corrections" $\mu(1), \mu(2), \ldots, \mu(N)$. When the corrections $\mu(j)$ are calculated, the "old" values $\lambda(i)$ are replaced by the updated "new" values $\lambda(j)+\mu(j))$. We refer to the combined operation of a channel detector and the LDPC decoder as an outer iteration. As we already mentioned before, the log-likelihood ratios updated by the LDPC decoder can be sent back to the channel detector, and this will start the second outer iteration. This iterative process can be stopped after a predefined number of outer iteration, or according to some other rule.

Figure 3:
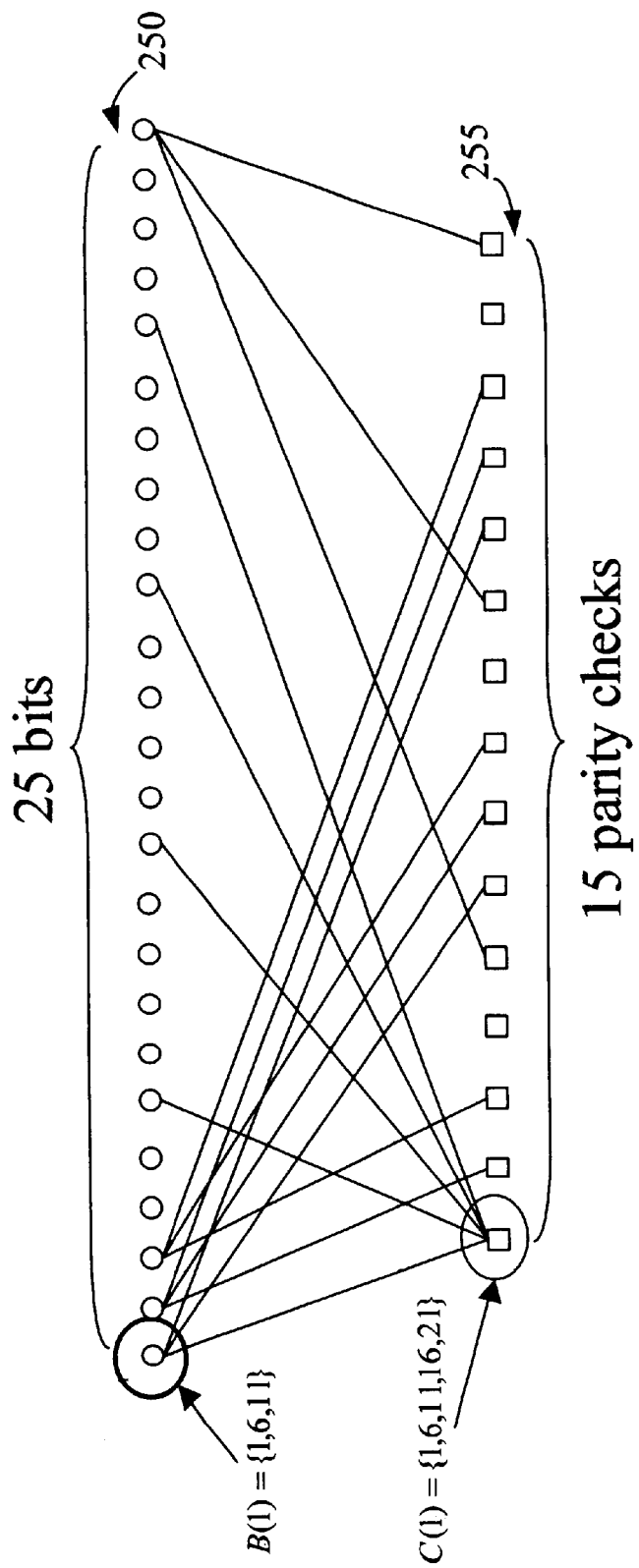
FIG. 3 is a bipartite graph of one low density parity check (LDPC) code.

Inner decoding iteration. Usually, using an input $\lambda(1)$, $\lambda(2), \ldots, \lambda(N)$, the LDPC decoder 215 calculates the corrections $\mu(1), \mu(2), \ldots, \mu(N)$ in an iterative manner as well. Although these inputs and outputs are vectors, internally the LDPC decoder operates with stacks of inputs $\lambda(j)=\{\lambda(i,j), 1 \leq i < k\}$, and outputs $\mu(j)=\{\mu(i,j), 1 \leq i < k\}$, for each code bit $u_j$, $1 \leq j < N$. In this application the Message Passing Algorithm (MPA) described below is considered as a basis for the implementation of the LDPC decoder 215. The operation of the LDPC decoder can be explained via a bipartite graph. An example of the bipartite graph for the parity check matrix given by Equation (2) is shown in FIG. 3. This graph has two kinds of vertices: 25 bit nodes (labeled 250) and 15 check nodes (labeled 255). An edge between a bit node and check node exists if the bit is included in the given check. The following two kinds of index sets are used in the MPA:

The j-th column index set B(j) consists of the numbers of all parity checks that contain the j-th code bit, and formally is defined by Equation (4).

$$B(j)=\{i: h_{i,j}=1, 1 \leq i \leq M\} \quad (4)$$

where $h_{i,j}$ is an element of i-th row and j-th column of the parity check matrix H. For example, B(1)={1,6,11}, B(2)={2,7,12},..., B(25)={5,9,13} for the parity check matrix H defined by Equation (2), and B(1)={1,2,5}, B(2)={2,3,6},..., B(26)={2,7,13} for the parity check matrix H defined by Equation (3). The letter "B" points here on bits.

The i-th row index set C(i) of H consists of positions of the code bits involved in the i-th parity check equation, and formally defined by Equation 5.

$$C(i)=\{j: h_{i,j}=1, 1 \leq j \leq N\} \quad (5)$$

where $h_{i,j}$ is again an element of i-th row and j-th column of the parity check matrix H. For example, C(1)={1,6,11,16,21}, C(2)={2,7,12,17,22},..., C(15)={5,8,11,19,22} for the parity check matrix H defined by Equation (2), and C(1)={1,10,14,20,25}, C(2)={1,2,11,15,21,26},..., C(13)={9,12,13,19,24,26} for the parity check matrix H defined by Equation (3). The letter "C" points here on checks.

Figure 4:
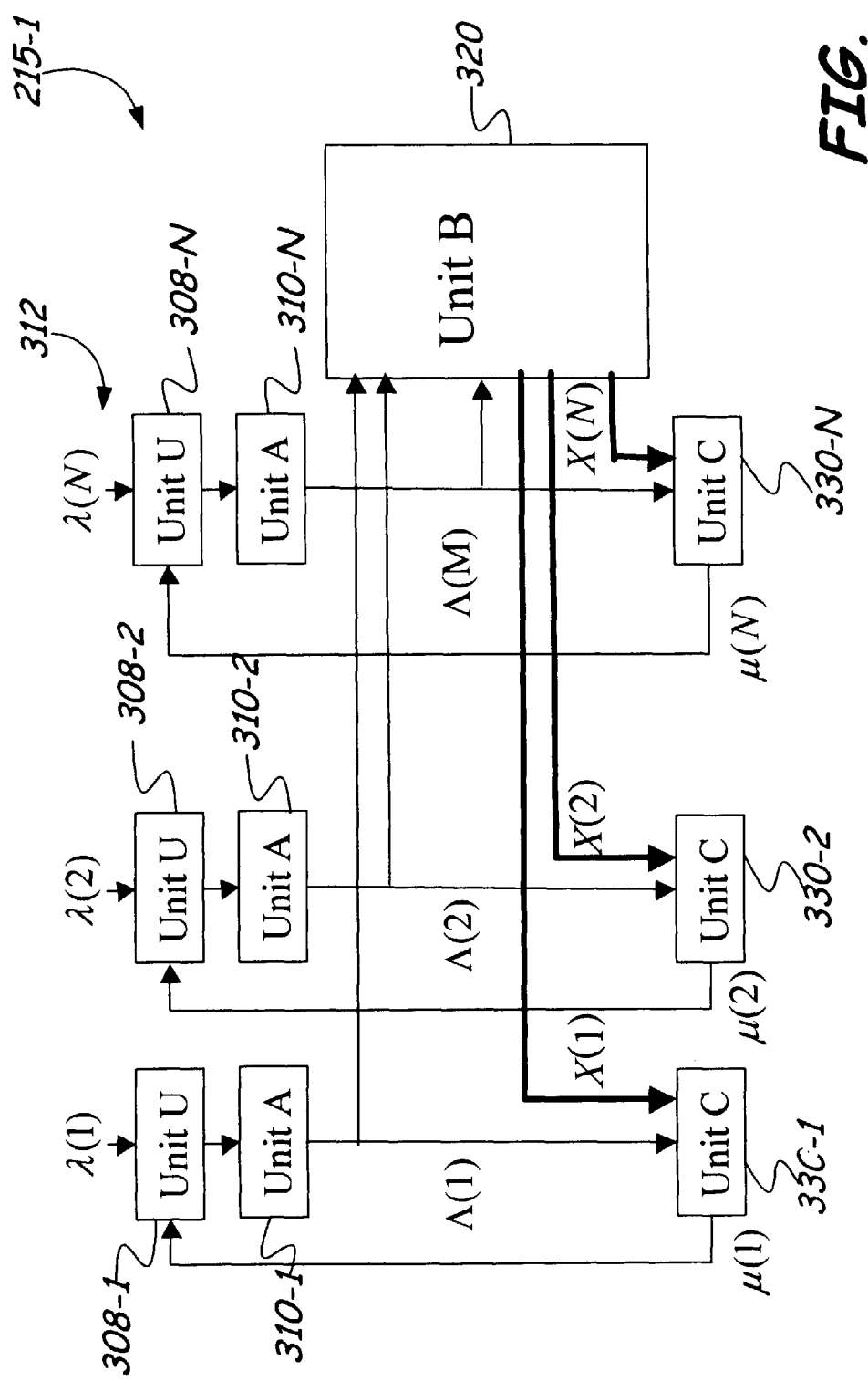
FIG. 4 is a block diagram illustrating first embodiments of the LDPC decoder shown in FIG. 2.

The actual operations performed by the MPA and illustrated by the bipartite graph shown in FIG. 3 are described below. FIG. 4 shows the block diagram of a first embodiment 215-1 of the LDPC decoder 215 that consists of N units A (labeled 310-1 through 310-N), a unit B 320, N units C (labeled 330-1 through 330-N), and N units U (labeled 308-1 through 308-N).

Unit A. As it is shown in FIG. 4, each input $\lambda(i,j)$, $1 \leq i \leq k$, $1 \leq j \leq N$, is passed through one of the units A 310-3, and converted to the real number defined in Equation (6).

$$\Lambda(i,j) = \tanh\left(-\frac{\lambda(i,j)}{2}\right) = \frac{e^{-\lambda(i,j)}-1}{e^{-\lambda(i,j)}+1}. \quad (6)$$

These output values of units A are sent to the inputs of the corresponding units C 330 and to the unit B 320.

Unit B. The function of this unit 320 is the calculation of the following products (one for each row of the matrix H):

$$X(i)=\Pi_{j \in C(i)}\Lambda(i,j), 0 \leq i < M, \quad (7)$$

where C(i) is defined by Equation (5). Different simple implementations of the block B circuit 320 are considered later.

Unit C. Each value $\mu(i,j)$, $1 \leq i \leq k$, $1 \leq j \leq N$ is calculated in a unit C 330 using an output $\Lambda(i,j)$ of the input stack and the output X(i) of the unit B 320 as follows:

$$Y(i,j)=X(i)/\Lambda(i,j), \quad (8)$$

$$\mu(i,j) = \log\frac{1-Y(i,j)}{1+Y(i,j)}, \quad (9)$$

This sequence of calculations can be illustrated using bipartite graphs. With the each bit node we associate k values $\lambda(i,j)$ and $\Lambda(i,j)$ enumerated by the first index $1 \leq i \leq k$ (the second index $1 \leq j \leq N$ refers to the bit itself). Then for all check notes using unit B we calculate the values $X(i)=\Pi_{j \in C(i)}\Lambda(i,j)$, $1 \leq i \leq M$, where the set C(i) can be interpreted as a set of incoming edges of the i-th check node. When all check nodes are assigned the values X(i), we go back to bit notes and calculate the values $\mu(i,j)$, $1 \leq i \leq k$, $1 \leq j \leq N$., as it was just described using Equations (8) and (9). Finally, using the column index sets B(j) for the next internal iteration, we update the input values $\lambda(i,j)$ using unit U circuits 308 according to the following rule.

Unit U. The new j-th input stack is calculated using Equation (10):

$$\lambda(i,j) = \lambda(j) + \sum_{i \in B(j) \setminus i} \mu(i,j), \quad (10)$$

where the set B(j)\i is the set B(j) without the element i, and $1 \leq i \leq k$, $1 \leq j \leq N$.

Controller. In an implementation of unit B 320 shown in FIG. 5, a function of the controller 385 is the synchronization of all operations in time domain. In particular, the controller changes positions of the top row of switches in FIG. 5 after each block of m inputs is fed to the unit E. This operation is performed t times during one inner iteration, and each time the next control vector $b_l=(b_{1,l}, b_{2,l}, \ldots, b_{m,l})$ is read from ROM and sets positions of switches. Here, the l-th control vector $b_l$ is the transposed first column of the l-th circulant of H with elements "1" replaced by their numbers in this column. For example, the first control vector $b_1=(1, 0,0,0,0,2,0,0,0,0,3,0,0,0,0)$ corresponds to the first transposed column (1,0,0,0,0,1,0,0,0,0,1,0,0,0,0) of equation (2). When all N inputs are fed to the input E, the controller closes all switches in the bottom line of FIG. 5, and make the contents X(i) of the shift register available to the units C.

The Equations (4)–(10) describe the operation of a generic MPA decoder, and do not use the specific structure of the parity check matrix shown in Equation (1). Below we describe the novel method of implementing the specific units, and this implementation essentially use the fact that H is constructed from circulants.

Implementations of the unit B. For the LDPC codes with the parity check matrix consisting from one strip of t circulants of the size m×m (a=1) the unit B (circuit 320) can be constructed in a number of ways to provide different tradeoffs in speed (calculation time) and hardware complexity (number of gates). A wide class of codes with the circular property can be constructed from Kirkman systems. An example of such a parity check matrix H is given by Equation (3), where m=13 and t=2. In this example, the parity check matrix consists of two circulants of the size 13×13.

First, let us consider so called "full serial implementation" (referenced in FIG. 5 as 320-1) of the unit B which uses only one shift register 350 of length m with feedback. We also call this shift register as unit E. It consists of m delay elements 360 shown as boxes, and is capable of storing real numbers with some predefined level of accuracy. Between the delay elements 360 are multiplication elements 370 with two inputs and one output. An output of each multiplication element 370 is a product of real numbers at its inputs. Each multiplication element 370 is connected to the adjacent delay elements 360 and the input bus 372 through the corresponding switch 375 (there are M switches 375) controlled by the vector 380 ($b_{1,l}, b_{2,l}, \ldots, b_{m,l}$) stored in read only memory (ROM) 382 and described before in the controller section. Each such vector coincides with the first column of one of the circulants. All delay elements 360 are initially reset to 1 (store the real number 1.0). The unit E operates as follows.

The inputs of the block E: $\Lambda(1), \Lambda(2), \ldots, \Lambda(N)$, are fed through the input bus 372 sequentially. During these N time intervals, the positions of switches 375 are changed only t times: when after the first m inputs $\Lambda(1), \Lambda(2), \ldots, \Lambda(m)$ are fed, when the second m inputs $\Lambda(m+1), \Lambda(m+2), \ldots, \Lambda(2m)$ are fed, and so on. Initially, all switches 375 are set according to the first control vector ($b_{1,l}, b_{2,l}, \ldots, b_{m,l}$), as follows. If $b_{i,l}=0$, the top input of the multiplier is set to 1.0, otherwise it is connected to the $b_{i,l}$-th input line, and became equal to $\Lambda(b_{i,l},j)$. After feeding the first input block $\Lambda_1$, but before feeding the second block $\Lambda_2$, the switches 375 are set according to the second control vector ($b_{1,2}, b_{2,2}, \ldots, b_{m,2}$), and so on. All t control vectors are stored in ROM 382, or generated by logic circuits. The controller 385 shown in FIG. 5 does the synchronization of all these operations.

When all N values $\Lambda(1), \Lambda(2), \ldots, \Lambda(N)$ are entered, the delay elements 360 of the shift register will contain the products $X(1), X(2), \ldots, X(M)$ defined by Equation (5). The following example illustrates this process, how the last statement can be verified in the general case.

EXAMPLE 1

Let a=1, t=2, M=m=4, N=tm=8 and $$H = \begin{bmatrix} 1 & 0 & 0 & 1 & 1 & 1 & 0 & 0 \\ 1 & 1 & 0 & 0 & 0 & 1 & 1 & 0 \\ 0 & 1 & 1 & 0 & 0 & 0 & 1 & 1 \\ 0 & 0 & 1 & 1 & 1 & 0 & 0 & 1 \end{bmatrix}$$

For simplicity, let us denote the inputs a1=$\Lambda(1,1)$, b1=$\Lambda(1,2)$, c1=$\Lambda(1,3)$, d1=$\Lambda(2,4)$,
a2=$\Lambda(2,1)$, b2=$\Lambda(2,2)$, c2=$\Lambda(2,3)$, d2=$\Lambda(1,4)$,
e1=$\Lambda(1,5)$, f1=$\Lambda(2,5)$, g1=$\Lambda(2,7)$, h1=$\Lambda(2,8)$
e2=$\Lambda(2,5)$, f2=$\Lambda(1,5)$, g2=$\Lambda(1,7)$, h2=$\Lambda(1,8)$.

Therefore, in this case the unit B 320-1 must finally produce the following four products specified in Equations (7), and contains a corresponding number of switches 375 and delay elements 360.

$X(1)=\Lambda(1,1)\cdot\Lambda(1,4)\cdot\Lambda(1,5)\cdot\Lambda(1,6)=$a1$\cdot$d2$\cdot$e1$\cdot$f2,
$X(2)=\Lambda(2,1)\cdot\Lambda(1,2)\cdot\Lambda(2,6)\cdot\Lambda(1,7)=$a2$\cdot$b1$\cdot$f1$\cdot$g2,
$X(3)=\Lambda(2,2)\cdot\Lambda(1,3)\cdot\Lambda(2,7)\cdot\Lambda(1,8)=$b2$\cdot$c1$\cdot$g1$\cdot$h2,
$X(4)=\Lambda(2,3)\cdot\Lambda(2,4)\cdot\Lambda(2,5)\cdot\Lambda(2,8)=$c2$\cdot$d1$\cdot$e2$\cdot$h1 ...

FIG. 6-1 illustrates a portion of unit B 320-1, and shows positions of the switches 375 during the first four time intervals when the first four pairs of inputs (a1,a2), (b1,b2), (c1,c2) and (d1,d2) are fed to the scheme. As we described before, the positions of the switches are defined by the first control vector [1,2,0,01]. Using this figure, we can easily track the contents of the delay elements 360 while the pairs (a1,a2), (b1,b2), (c1,c2) and (d1,d2) are received:

| Initial state: | 1 | 1 | 1 | 1 |
| After feeding a: | a2 | 1 | 1 | a1 |
| After feeding b: | b2 | 1 | a1 | a2 b1 |
| After feeding c: | c2 | a1 | a2 b1 | b2 c1 |
| After feeding d: | a1 d2 | a2 b1 | b2 c1 | c2 d1. |

Before feeding in the next four input pairs (e1,e2), (f1,f2), (g1,g2) and (h1,h2), the positions of the switches 375 are changed according to the second control vector [1002], as shown in FIG. 6-2. Using this setting, we can track the next four states of the delay elements 360:

| After feeding e: | a2b1 | b2c1 | c2d1e2 | a1d2e1 |
| After feeding b: | b2c1 | c2d1e2 | a1d2e1f2 | a2b1f1 |
| After feeding c: | c2d1e2 | a1d2e1f2 | a2b1f1g2 | b2c1g1 |
| After feeding d: | a1d2e1f2 | a2b1f1g2 | b2c1g1h2 | c2d1e2h1. |

After the comparison of the last line and Equations (8), we see after feeding in all eight inputs the delay elements 360 contain the desired products X(j).

Figure 5:
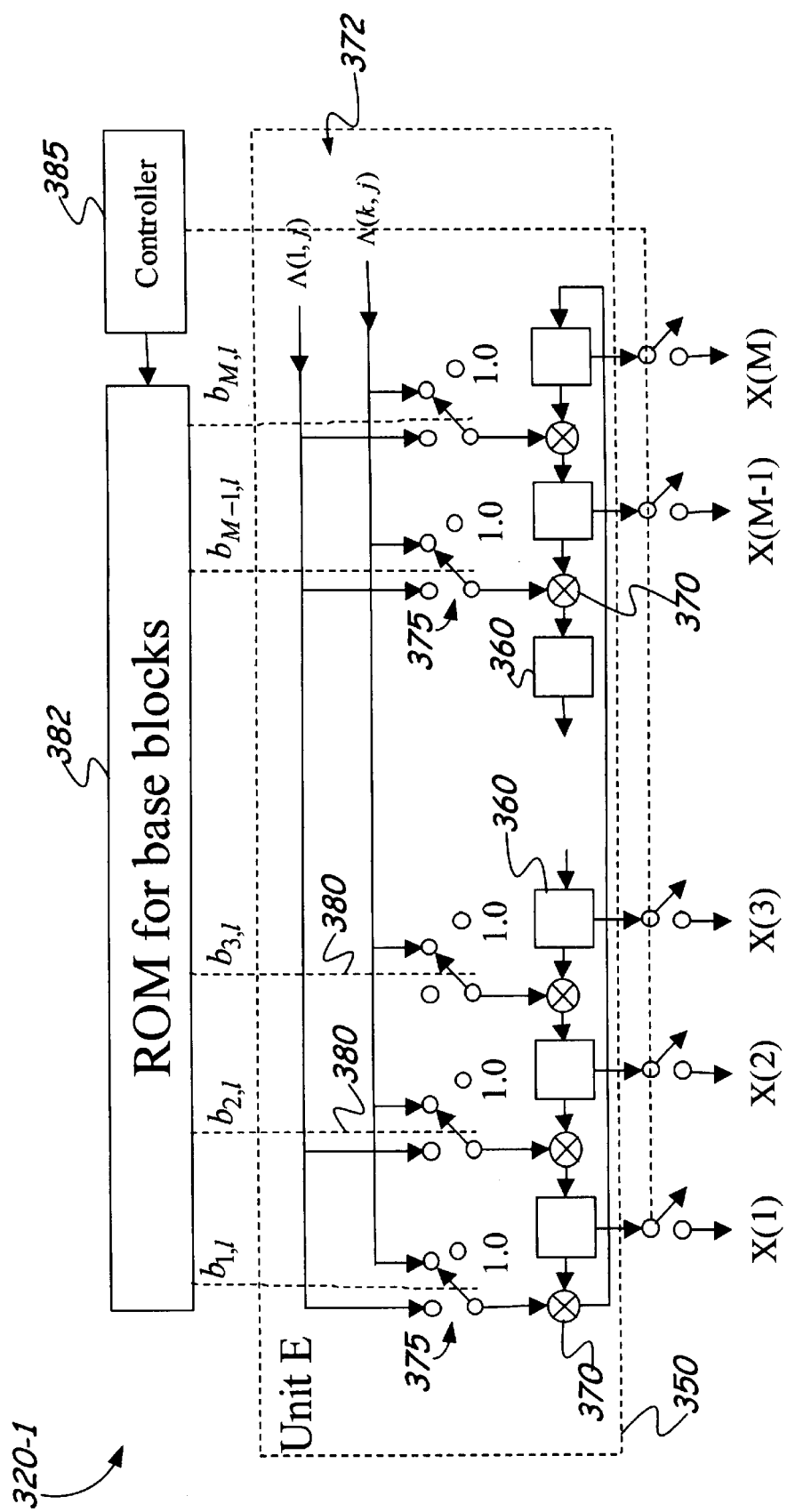
Figure 7:
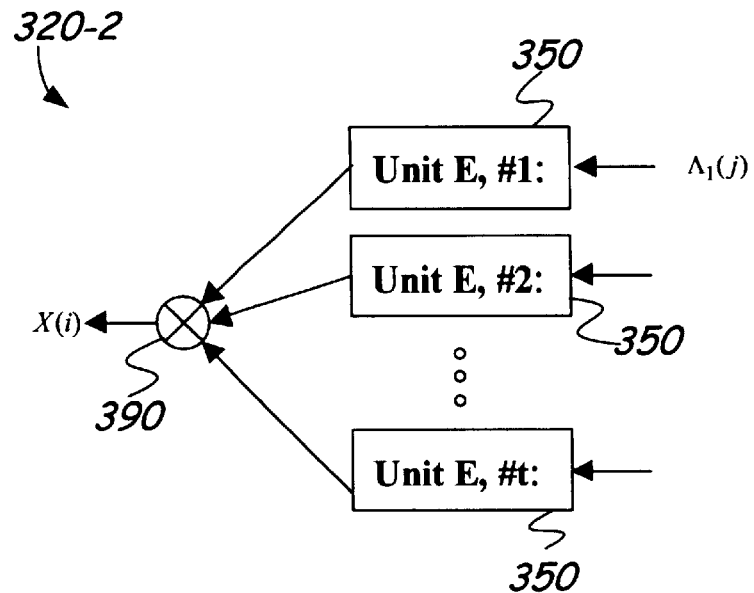
Figure 8:
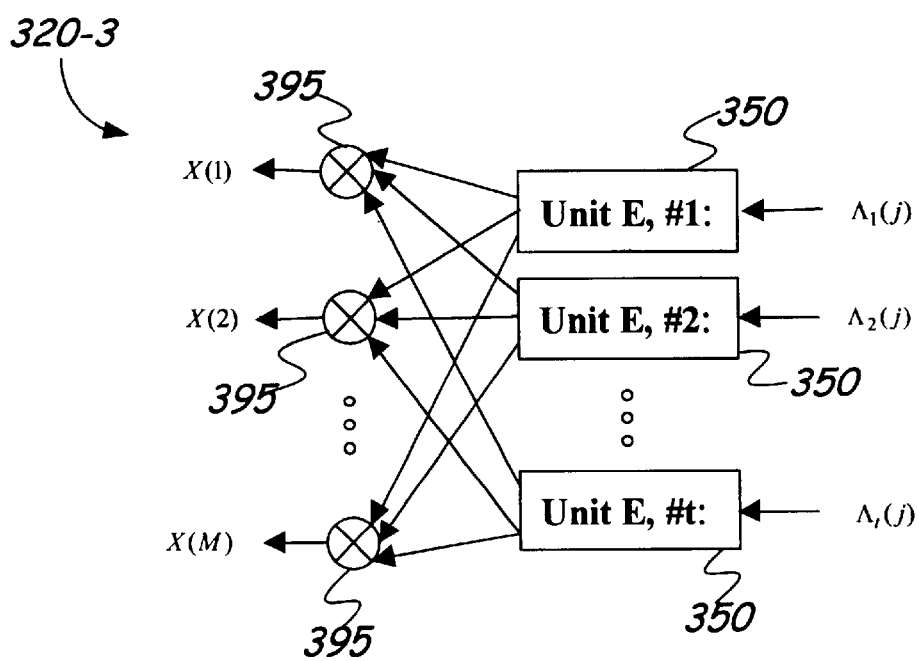

FIG. 7 and 8 show other implementations of the unit B circuit 320 which are faster then the scheme (320-1) shown in FIG. 4, but require more delay elements. These implementations are referred to herein as "serial-parallel" and "full parallel," respectively, and use t different shift registers 350 (one for each base block of H). In this case, there is no need for switches in the feedback and many of the multipliers, since the coefficients $b_{j,i}$ in each shift register are fixed. The input sequence of $\Lambda(i)$ is split onto t subsequences $\Lambda_h(i)$, $0 \leq h < t$, corresponding to t circulants of H:

$\Lambda_1(j)=(\Lambda(1),\Lambda(2), \ldots, \Lambda(m))$
$\Lambda_2(i)=(\Lambda(m+1), \Lambda(m+2), \ldots, \Lambda(2*m))$,
$\Lambda_3(j)=(\Lambda(2m+1), \Lambda(2m+2), \ldots, \Lambda(3m)), \ldots$ These subsequences are entered into the shift registers 350 in parallel. When it is done, each unit E will have a vector of partial products corresponding to different circulants of H. Then by multiplying the real numbers contained in the delay elements #1 in different units E (i.e., similarly positioned delay elements from each of the different units E, in this case the left most delay element in each unit E as shown in FIG. 5), we get X(1). In same way, by multiplying the real numbers contained in the delay elements #2 gives X(2), and so on. This can be done sequentially using just one multiplier 390 with t inputs. Such implementation is called serial-parallel, and illustrated in FIG. 7 unit B circuit 320-2. If m multipliers 395 are used in parallel, the implementation is called full parallel, and is illustrated in FIG. 8 as unit B circuit 320-3.

It is also possible to implement an LDPC decoder without the multiplication elements, and can be done using the following Equations:

$$V(i, j) = \log\Lambda(i, j) = \log\tanh\left(-\frac{\lambda(i, j)}{2}\right), \tag{11}$$

$$W(i) = \log X(i) = \sum_{j \in C(i)} V(i, j), \tag{12}$$

$$Y(i,j) = \exp(W(i) - V(j)), \tag{13}$$

Figure 9:
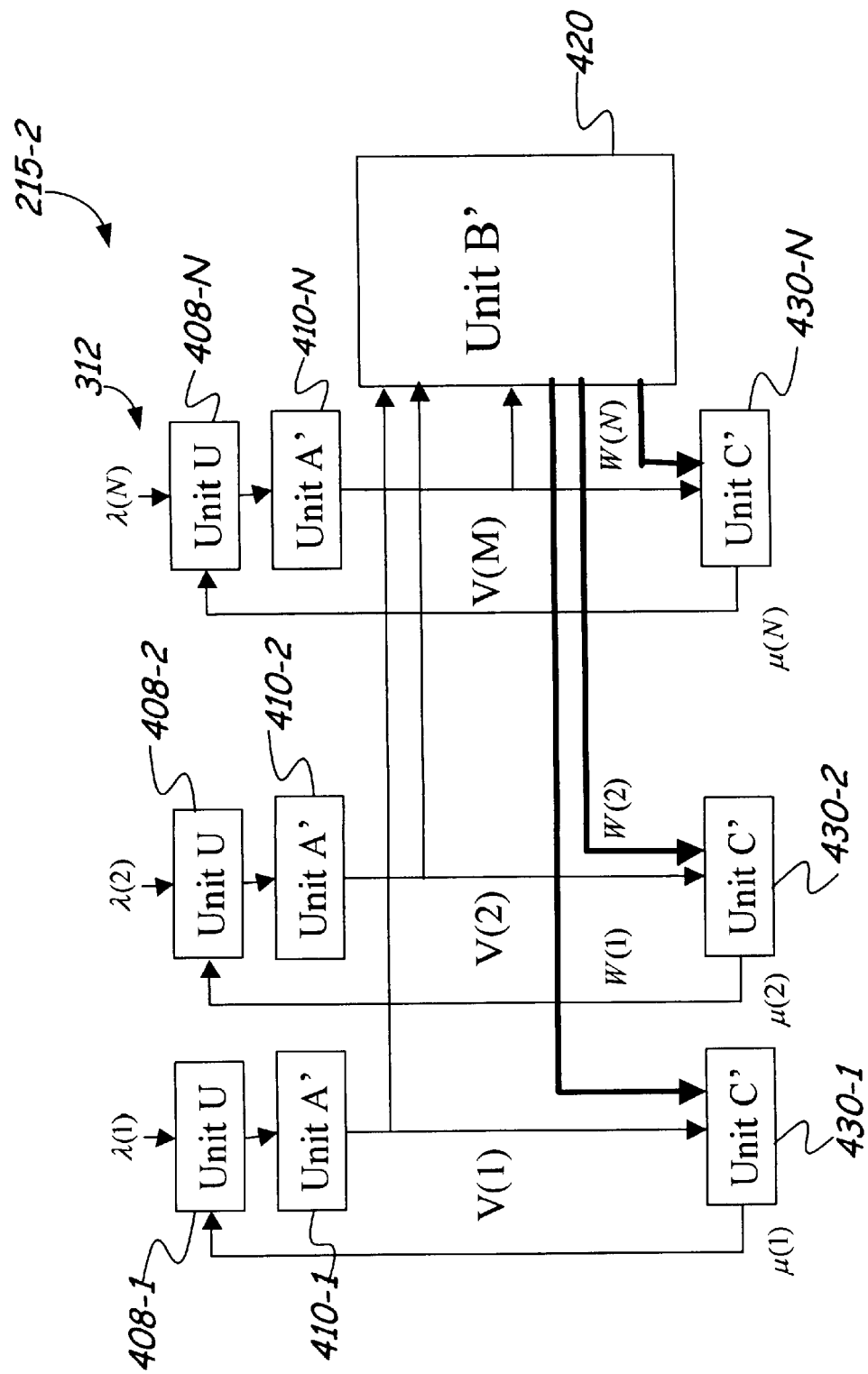
FIG. 9 is a block diagram illustrating second embodiments of the LDPC decoder shown in FIG. 2.
Figure 10:
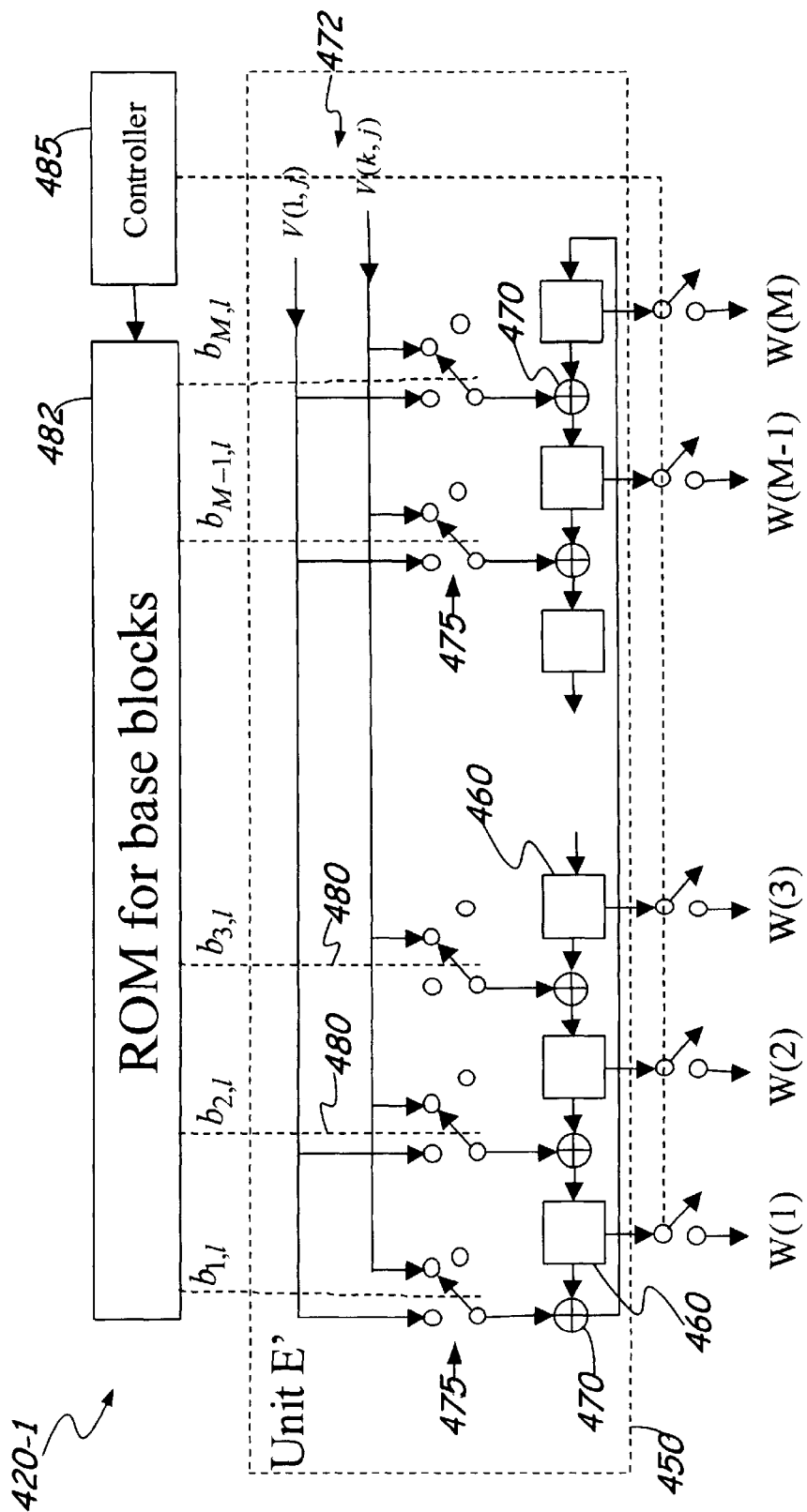
FIGS. 10, 11 and 12 are block diagrams illustrating in greater detail portions of the LDPC decoder shown in FIG. 9, in accordance with various alternate embodiments.
Figure 11:
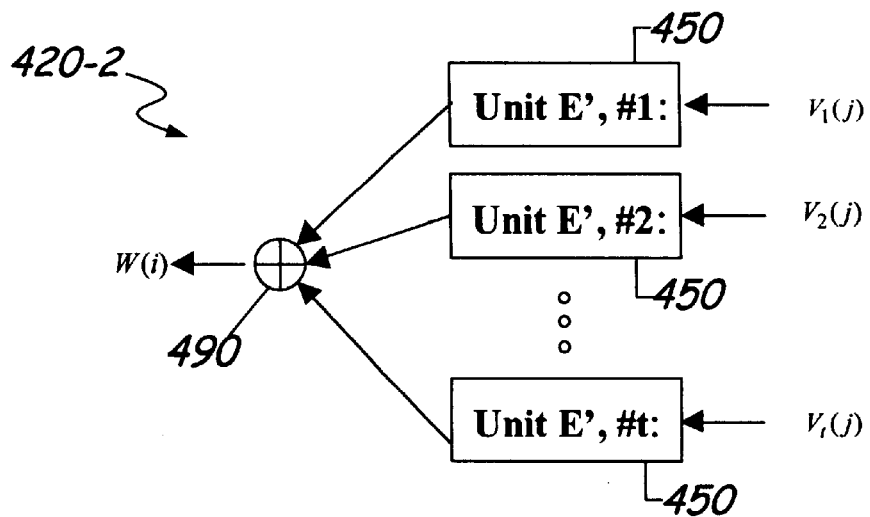
Figure 12:
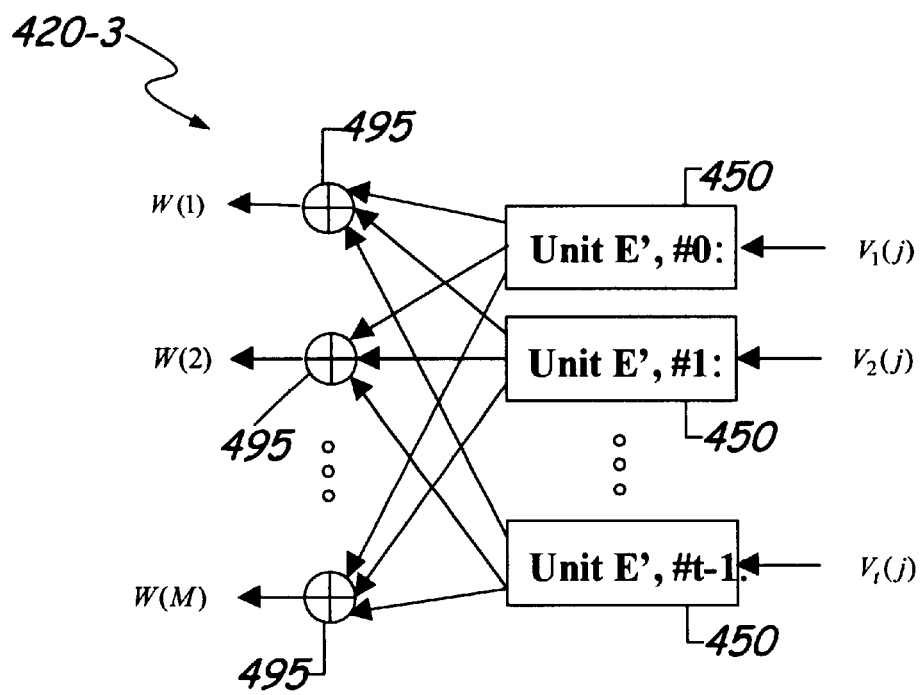

Using Equations (11), (12) and (13) instead of Equations (4), (5) and (7), respectively, multiplication elements 370 can be replaced with addition (summation) elements 470 (FIG. 10). These two sets of Equations are equivalent, but lead to different implementations. In a second embodiment 215-2 of LDPC encoder 215, which is shown in FIG. 9, the new units A' (410), B' (420), C' (430) and E' (450 shown in FIG. 10) are used instead of units A (310), B (320), C (330) and E (350), respectively. Their functions and descriptions are similar to what we already provided above with reference to FIGS. 4–8. Using the corresponding operations, the circuits shown in FIGS. 9 through FIG. 12 can be used instead of FIGS. 4–8. For ease of understanding how the above analysis of FIGS. 4–8 applies to the embodiments shown n FIGS. 9–12, the description of numbers in the 300's in FIGS. 4–8 corresponds to numbers in the 400's in FIGS. 9–12 (delay elements 360 correspond to delay elements 460, etc.), except that addition elements are used instead of multiplication elements (i.e., elements 470 instead of 370 in FIG. 10, element 490 instead of 390 in FIG. 11, and elements 495 instead of 395 in FIG. 11).

In summary, the present invention includes a communication system 100, which can be for example a data storage system, for decoding data which is encoded with a linear low density parity check code having a parity check matrix H constructed from circulants. The communication system includes a channel detector (214) which provides as an output log-likelihood ratios, each log-likelihood ratio being indicative of a probability that a transmitted bit u of a code word is equal to 1. The communication system also including a low density parity check code decoder (215) coupled to the channel detector and receiving the log-likelihood ratios λ as an input, the decoder configured to convert the log-likelihood ratios into real numbers Λ, to generate corrections $\mu$ to the log-likelihood ratios λ, and to generate corrected log-likelihood ratios λ' as a function of the log-likelihood ratios λ and the corrections $\mu$, the decoder providing as an output a binary signal.

In some embodiments, the decoder (215; 215-1) further includes conversion circuitry (310) which receives a stack of i log-likelihood ratios λ(i,j) for the $j^{th}$ bit $u_j$ of the code word and converts the stack of log-likelihood ratios into a stack Λ(i,j) of real numbers. The conversion circuitry also includes product calculation circuitry (320) coupled to the conversion circuitry (310) which generates for each row of the parity check matrix H a product X(i) from the real numbers, where X(i) is substantially of the form $X(i)=\Pi_{j \in C(i)} \Lambda(i,j)$, $0 \leq i < M$, where C(i) is substantially of the form $C(i)=\{j: h_{i,j}=1, 1 \leq j \leq N\}$, and where $h_{i,j}$ is an element of i-th row and j-th column of the parity check matrix H. Correction generating circuitry (330) coupled to the conversion circuitry (310) and the product calculation circuitry (320) generates the corrections $\mu$ by generating each correction value $\mu(i,j)$ of a stack of correction values using corresponding values from the stack Λ(i,j) of real numbers and using the corresponding product X(i) from the real numbers using a relationship substantially of the form $$\mu(i, j) = \log \frac{1 - Y(i, j)}{1 + Y(i, j)},$$

where Y(i,j) is substantially of the form Y(i,j)=X(i)/Λ(i,j).

In some embodiments, the decoder further comprises log likelihood ratio stack generating circuitry (308) coupled to the conversion circuitry (310) and to the correction generating circuitry (330), the log likelihood ratio stack generating circuitry (308) calculating a new $j^{th}$ input stack λ(i,j) using a relationship substantially of the form $$\lambda(i, j) = \lambda(j) + \sum_{i \in B(j) \setminus i} \mu(i, j),$$

where the $j^{th}$ set B(j) includes the numbers of all parity checks of the low density parity check code that contain the $j^{th}$ code bit, and wherein set B(j)\i is the $j^{th}$ set B(j) without the element i, and wherein $1 \leq i \leq k$, $1 \leq j \leq N$.

In some embodiments of the communication system, the product calculation circuitry (320; 320-1) further includes an input bus (372) carrying the stack Λ(i,j) of real numbers, and a memory device (382) storing multiple control vectors, with each of the control vectors corresponding to first column of one of the circulant sub-matrices of the parity check matrix H. In these embodiments, the product calculation circuitry further includes a first set of m switches (375) coupled to the memory device and being controlled by one of the control vectors at a time, each of the first set of switches having inputs coupled to the input bus and having an output. The product calculation circuitry further includes a shift register (350) including m delay elements (360) and m multiplication elements (370), a first input of each multiplication element being coupled to an output of a first corresponding delay element, a second input of each multiplication element being coupled to the output of a corresponding one of the first set of switches (375), an output of each multiplication element being coupled to an input of a second corresponding delay element, wherein the product X(i) from the real numbers is provided by the delay elements. In some embodiments of the invention, the product calculation circuitry (320; 320-1) further comprises a controller coupled to the memory device and controlling which of the control vectors is used to control the first set of m switches.

In other embodiments of the communications system of the present invention, the product calculation circuitry (320; 320-2) further includes a plurality of parallel shift registers (350), wherein each of the plurality of shift registers has fixed feedback connections, and wherein an input sequence of Λ(i) is split onto t subsequences $\Lambda_h(i)$, $0 \leq h < t$, corresponding to t circulants of H, each of the subsequences being entered into a different one of the plurality of shift registers 350 in parallel, each of the shift registers providing as an output a vector of partial products corresponding to different circulant sub-matrices of the parity check matrix H. The product calculation circuitry further includes a multiplication element (390) receiving as inputs the vectors of partial products from each of the plurality of parallel shift registers and sequentially providing as an output the products X(i).

In still other embodiments of the present invention, the product calculation circuitry (320; 320-3) further comprises a plurality of parallel shift registers (350), wherein each of the plurality of shift registers has fixed feedback connections, , and wherein an input sequence of Λ(i) is split onto t subsequences $\Lambda_h(i)$, $0 \leq h < t$, corresponding to t circulants of H, each of the subsequences being entered into a different one of the plurality of shift registers 350 in parallel, each of the shift registers providing as an output a vector of partial products corresponding to different circulant sub-matrices of the parity check matrix H. In these embodiments, the product calculation circuitry (320; 320-3) further comprises a plurality of multiplication elements (395) each receiving as inputs the vectors of partial products from each of the plurality of parallel shift registers and providing as an output a corresponding one of the products X(i).

In some embodiments of the communication system of the invention, decoder (215; 215-2) further comprises conversion circuitry (410) which receives a stack of i log-likelihood ratios λ(i,j) for the j$^{th}$ bit u$_j$ of the code word and converts the stack of log-likelihood ratios into a stack V(i,j) of real numbers. In these embodiments, the decoder also includes summation calculation circuitry (420) coupled to the conversion circuitry (410) which generates for each row of the parity check matrix H a summation W(i) from the stack V(i,j) of real numbers, wherein W(i) is determinable using a relationship substantially of the form $$W(i) = \sum_{j \in C(i)} V(i, j),$$

and correction generating circuitry (430) coupled to the conversion circuitry (410) and the summation calculation circuitry (420) which generates the corrections μ by generating each correction value μ(i,j) of a stack of correction values. Each correction value μ(i,j) of a stack of correction values is generated using corresponding summations W(i) and real numbers according to a relationship substantially of the form $$\mu(i, j) = \log \frac{1 - Y(i, j)}{1 + Y(i, j)},$$

where Y(i,j) is substantially of the form Y(i,j)=exp(W(i)−V(j)).

A method of decoding data, which is encoded with a linear low density parity check code having a parity check matrix H constructed from circulants, includes generating log-likelihood ratios with a channel detector (214), each log-likelihood ratio being indicative of a probability that a transmitted bit u of a code word is equal to 1. The log-likelihood ratios λ are converted into real numbers using a low density parity check code decoder (215). Also using the decoder, corrections μ to the log-likelihood ratios λ are generated. Further, the decoder generates corrected log-likelihood ratios λ' as a function of the log-likelihood ratios λ and the corrections μ, and provides a binary signal as an output.

It must be understood that the Equations defined herein can be implemented as approximations or scaled versions of the complete Equations. Therefore, references to specific Equations, to relationships substantially of the form defined by one or more Equations, and other references to Equations should be interpreted as including approximations of the Equations, scaled versions of the Equations (on one or both sides of the Equations), and other derivations of the Equations. These interpretations also apply to the claims appended hereto.

This clarification is related to the fact that the mathematical calculations defined by the equations (6)–(13) are usually done by the physical devices with limited precision of an internal nature or be set to some specific level artificially to minimize implementation complexity or satisfy other technical constraints. For example, the representation of the real numbers has usually finite length measured in bits per real number. Approximation of the functions, such as "tanh", "log" and "exp" and others, is also a standard technical solution which do not changes the basic principles of the decoding method. For example, clipping of the very large or very small values is often used to limit the range of analog values. Look-up tables can also be used to replace analog calculations in the digital implementation of the proposed decoder.

Appendix. Lattice Construction of the LDPC Codes.

In general, in combinatorics a design is a pair (V,B), where V is a set of some elements called points, and B is a collection of subsets of V called blocks. The numbers of points and blocks are denoted later by υ=|V| and b=|B|, respectively. If T≦υ is an integer parameter, such that any subset of T points from V is contained in exactly λ blocks, we deal with a T-design. A Balanced Incomplete Block Design (BIBD) is a T-design such that each block contains the same number of points k, and every point is contained in the same number of blocks r.

For illustration purposes we consider only BIBD's with T=2. Although such a BIBD still has five integer parameters υ, k, λ, b and r, only three of them are independent, since a straight forward proof can be used to demonstrate the relationships shown in Equations (A1) and (A2).

$$b \cdot k = v \cdot r \quad \text{(A1)}$$

$$r(k-1) = \lambda(v-1) \quad \text{(A2)}$$

Therefore, given three parameters, we can always find the other two parameters using Equations (A1) and (A2). The notation (υ,k,λ)-BIBD is used for a BIBD with υ points, block size k, index λ and T=2. A (υ,k,1)-BIBD with l=1 is called a Steiner system. A Steiner system with k=3 is called a Steiner triple system. A BIBD is resolvable if there exists a partition of its block set B into parallel classes, each of which partitions the point set V. A resolvable Steiner triple system is called Kirkman system. The Roy-Chaudhuri and Wilson solution of the Kirkman problem leads to the systematic construction of Kirkman systems. In this disclosure, we use a novel construction of the BIBD based on 2-dimentional integer lattices described below.

First, let us consider a rectangular integer lattice L={(x, y):0≦x≦k−1, 0≦y≦m−1}, where m is a prime number. Let l:L→V be a one-to-one mapping of the lattice L to the point set V. An example of such mapping is a simple linear mapping as shown in Equation (A3):

$$l(x,y)=m \cdot x+y+1. \quad \text{(A3)}$$

The numbers l(x,y) are referred to as lattice point labels. The k set of points is referred to as a line (or a block). A line with slope s starting at the point (x,a), 0≦s≦m−1 contains the points defined in Equation (A4):

$$\{(x, a+sx \bmod m):0 \leq x \leq k-1\} \quad \text{(A4)}$$

where 0≦a≦m−1.

EXAMPLE 1

Figure 13:
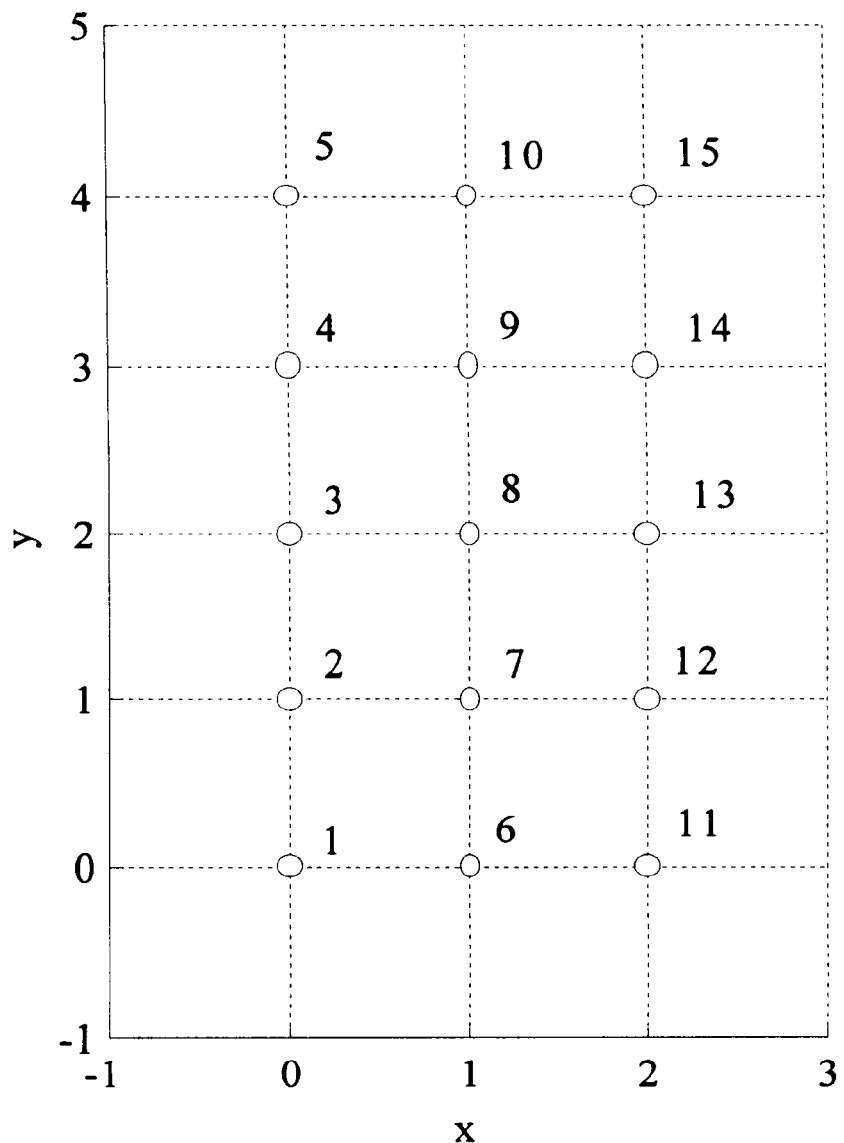
FIG. 13 is an example of a rectangular integer lattice used to illustrate features of LDPC matrices with which the decoders of the present invention can be used.

FIG. 13 depicts the rectangular integer lattice with m=5 and k=3. All lines of this lattice are listed below as defined by Equation (A4):

s = 0: {(0, 0), (1, 0)(2, 0)}, {(0, 1), (1, 1)(2, 1)},

{(0, 2), (1, 2)(2, 2)}, {(0, 3), (1, 3)(2, 3)}, {(0, 4), (1, 4)(2, 4)}, s = 1: {(0, 0), (1, 1)(2, 2)}, {(0, 1), (1, 2)(2, 3)},

{(0, 2), (1, 3)(2, 4)}, {(0, 3), (1, 4)(2, 0)}, {(0, 4), (1, 0)(2, 1)}, s = 2: {(0, 0), (1, 2)(2, 4)}, {(0, 1), (1, 3)(2, 0)},

{(0, 2), (1, 0)(2, 1)}, {(0, 3), (1, 1)(2, 2)}, {(0, 4), (1, 2)(2, 3)}, s = 3: {(0, 0), (1, 3)(2, 1)}, {(0, 1), (1, 4)(2, 2)},

{(0, 2), (1, 0)(2, 3)}, {(0, 3), (1, 1)(2, 4)}, {(0, 4), (1, 2)(2, 0)}, s = 4: {(0, 0), (1, 4)(2, 3)}, {(0, 1), (1, 0)(2, 4)},

{(0, 2), (1, 1)(2, 0)}, {(0, 3), (1, 2)(2, 1)}, {(0, 4), (1, 3)(2, 2)}.

Another way to represent these lines is used in Table A1, where all points are given by their labels (A3) instead of their coordinates (x,y).

TABLE A1

An example of the (15,3,1)-BIBD constructed from a lattice

| s = 0 | | | s = 1 | | | S = 2 | | | s = 3 | | | s = 4 | | |
|---|---|---|---|---|---|---|---|---|---|---|---|---|---|---|
| 1 | 6 | 11 | 1 | 7 | 13 | 1 | 8 | 15 | 1 | 9 | 12 | 1 | 10 | 14 |
| 2 | 7 | 12 | 2 | 8 | 14 | 2 | 9 | 11 | 2 | 10 | 13 | 2 | 6 | 15 |
| 3 | 8 | 13 | 3 | 9 | 15 | 3 | 10 | 12 | 3 | 6 | 14 | 3 | 7 | 11 |
| 4 | 9 | 14 | 4 | 10 | 11 | 4 | 6 | 13 | 4 | 7 | 15 | 4 | 8 | 12 |
| 5 | 10 | 15 | 5 | 6 | 12 | 5 | 7 | 14 | 5 | 8 | 11 | 5 | 9 | 13 |

Proposition 1. A set B of all $m^2$ k-element sets of V obtained by taking labels of points along the lines of a described lattice is a BIBD (Note that there are m different slopes s, $0 \leq s \leq m-1$, and m different lines for each slope.

Proof: Since m is a prime, for each lattice point (x,y) there is exactly one line with slope s that goes through (x,y). In other words, for each pair of lattice points, there is exactly one line with slope s that contains both points. Therefore, the set B of lines of different slopes is a 2-design with $b=m^2$ blocks and a block size k.

Proposition 2. Each point in the design occurs in exactly m blocks.

Proposition 3. The number of blocks can be increased by creating the blocks consisting of points laying on "vertical" lines. By this way we can create additional m blocks. If m/k is small, constructing additional blocks can be done manually, however, when $(m/k) \geq k$ for each vertical line, say x=i, we can take the points $m \cdot x+y+1, 0 \leq y \leq m-1$, and form a new lattice. Now we start from a new lattice and use the same design construction by taking lines with different slopes.

Proposition 4. The number of blocks can be increased by creating the blocks consisting of points laying on "vertical" lines. By this way we can create additional m blocks. If m/k is small, constructing additional blocks can be done manually, however, when $(m/k) \geq k$ for each vertical line, say x=i, we can take the points $m \cdot x+y+1, 0 \leq y \leq m-1$, and form a new lattice. Now we start from a new lattice and use the same design construction by taking lines with different slopes.

Proposition 5. The lattice construction can be extended to nonprime vertical dimensions m, but the slopes must not have common factors with m. For example, if m=6 and k=3, then the lines {1,7,13} and {1,10,13} with the slopes 0 and 3, respectively, both contain the pair of points {1,3}, and therefore both these lines can not be included in the 2-design. The number of slopes that are relatively prime to m is equal to $1+\phi(m)$, where $\phi(m)$ is the Euler function defined as the number of prime numbers less then m (slope 0 is always included).

Figure 14:
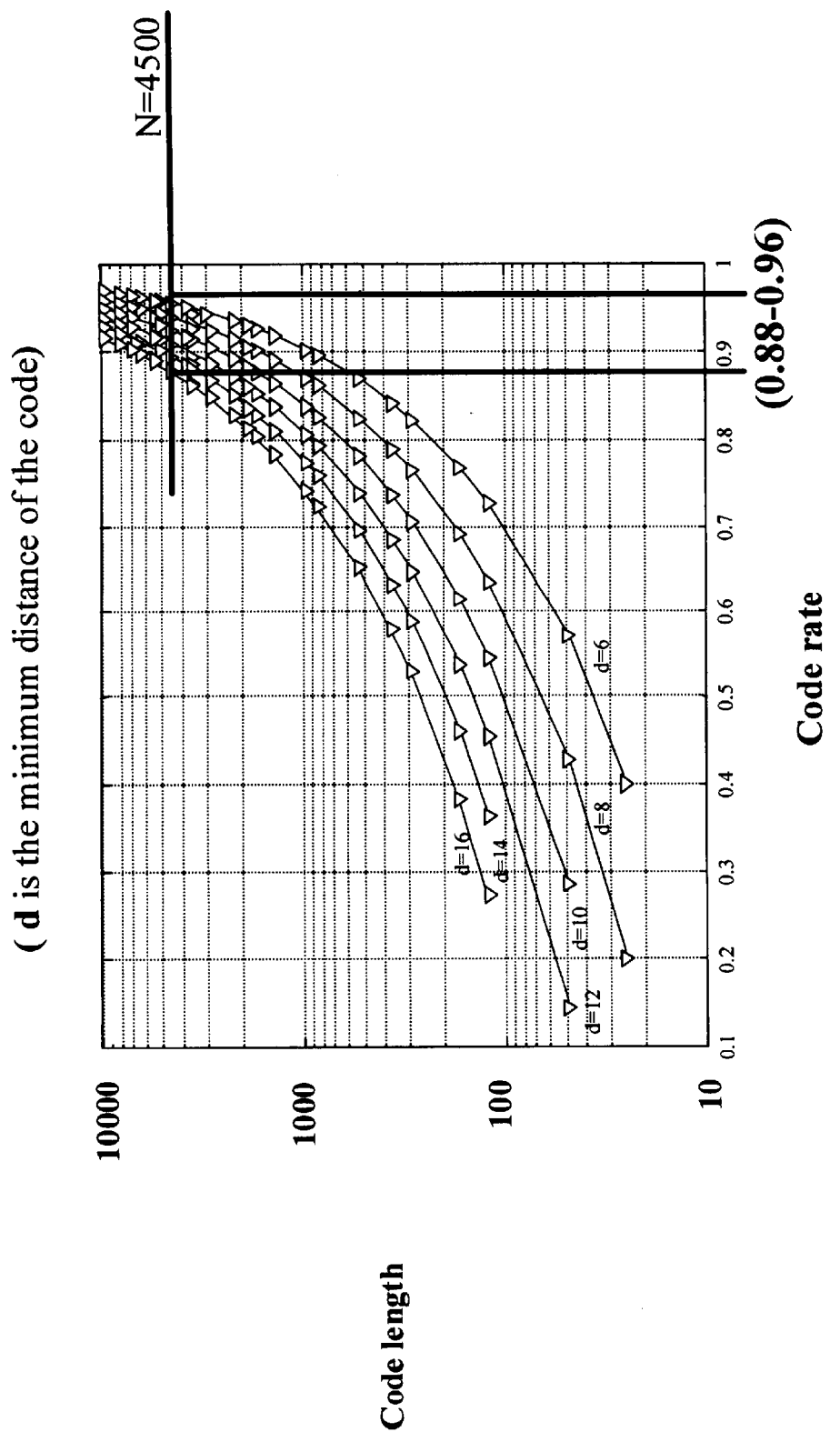
FIG. 14 is a plot illustrating the minimum length of lattice LDPC codes as a function of a required length for different fixed values of the minimum Hamming distance.

A point-block incidence matrix $H=(h_{ij})$ of a design (V,B) has $\upsilon$ rows and b columns with elements $h_{ij}=1$ if the i-th element of V occurs in the j-th block of B, and $h_{ij}=0$ otherwise. Since each block of the BIBD is incident with the same number of points k, and every point is incident with the same number of blocks r, then all columns of H has the same weight k, and all rows of H has the same weight r. Therefore, a point-block incidence matrix $H=(h_{ij})$ is in fact a parity check matrix of a Gallager code. This code has the length n=b and the rate R=(b-rank(H))/b. FIG. 14 shows the minimum length of the lattice LDPC codes as a function of the required length for different fixed value of the minimum Hamming distance.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the decoding system while maintaining substantially the same functionality without departing from the scope and spirit of the present invention. In addition, although an embodiment described herein is directed to a data storage system, it will be appreciated by those skilled in the art that the teachings of the present invention can be applied to communication systems in general, without departing from the scope and spirit of the present invention.

What is claimed is:

1. A communication system for decoding data which is encoded with a linear low density parity check code having a parity check matrix H constructed from circulants, the communication system comprising:

a channel detector which provides as an output log-likelihood ratios, each log-likelihood ratio being indicative of a probability that a transmitted bit u of a code word is equal to 1;

a low density parity check code decoder coupled to the channel detector and receiving the log-likelihood ratios $\lambda$ as an input, the decoder configured to convert the log-likelihood ratios into real numbers $\Lambda$, to generate corrections $\mu$ to the log-likelihood ratios $\lambda$, and to generate corrected log-likelihood ratios $\lambda'$ as a function of the log-likelihood ratios $\lambda$ and the corrections $\mu$, the decoder providing as an output a binary signal.

2. The communication system of claim 1, wherein the decoder further comprises:

conversion circuitry which receives a stack of i log-likelihood ratios $\lambda(i,j)$ for the $j^{th}$ bit $u_j$ of the code word and converts the stack of log-likelihood ratios into a stack $\Lambda(i,j)$ of real numbers;

product calculation circuitry coupled to the conversion circuitry which generates for each row of the parity check matrix H a product X(i) from the real numbers, where X(i) is approximately of the form $X(i)=\Pi_{j \in C(i)} \Lambda(i,j), 0 \leq i < M$, where C(i) is approximately of the form $C(i)=\{j : h_{i,j}=1, 1 \leq j \leq N\}$, and where $h_{i,j}$ is an element of i-th row and j-th column of the parity check matrix H; and correction generating circuitry coupled to the conversion circuitry and the product calculation circuitry which generates the corrections $\mu$ by generating each correction value $\mu(i,j)$ of a stack of correction values using corresponding values from the stack $\Lambda(i,j)$ of real numbers and using the corresponding product X(i) from the real numbers using a relationship approximately of the form $$\mu(i, j) = \log \frac{1 - Y(i, j)}{1 + Y(i, j)},$$

where Y(i,j) is approximately of the form $Y(i,j)=X(i)/\Lambda(i,j)$.

3. The communication system of claim 2, wherein the decoder further comprises log likelihood ratio stack generating circuitry coupled to the conversion circuitry and to the correction generating circuitry, the log likelihood ratio stack generating circuitry calculating a new $j^{th}$ input stack $\lambda(i,j)$ using a relationship approximately of the form $$\lambda(i, j) = \lambda(j) + \sum_{i \in B(j) \setminus i} \mu(i, j),$$

where the $j^{th}$ set B(j) includes the numbers of all parity checks of the low density parity check code that contain the $j^{th}$ code bit, and wherein set B(j)\i is the $j^{th}$ set B(j) without the element i, and wherein $1 \leq i \leq k$, $1 \leq j \leq N$.

4. The communication system of claim 2, wherein the product calculation circuitry further comprises:
an input bus carrying the stack $\Lambda(i,j)$ of real numbers;
a memory device storing a plurality of control vectors, with each of the plurality of control vectors corresponding to first column of one of the circulant sub-matrices of the parity check matrix H;
a first set of m switches coupled to the memory device and being controlled by one of the plurality of control vectors at a time, each of the first set of switches having inputs coupled to the input bus and having an output; and
a shift register including m delay elements and m multiplication elements, a first input of each multiplication element being coupled to an output of a first corresponding delay element, a second input of each multiplication element being coupled to the output of a corresponding one of the first set of switches, an output of each multiplication element being coupled to an input of a second corresponding delay element, wherein the product X(i) from the real numbers is provided by the delay elements.

5. The communications system of claim 4, wherein the product calculation circuitry further comprises a controller coupled to the memory device and controlling which of the plurality of control vectors is used to control the first set of m switches.

6. The communication system of claim 2, wherein the product calculation circuitry further comprises:
a plurality of parallel shift registers, wherein each of the plurality of shift registers has fixed feedback connections, and wherein an input sequence of $\Lambda(i)$ is split onto t subsequences $\Lambda_h(i)$, $0 \leq h < t$, corresponding to t circulants of H, each of the subsequences being entered into a different one of the plurality of shift registers 350 in parallel, each of the shift registers providing as an output a vector of partial products corresponding to different circulant sub-matrices of the parity check matrix H;
a multiplication element receiving as inputs the vectors of partial products from each of the plurality of parallel shift registers and sequentially providing as an output the products X(i).

7. The communications system of claim 2, wherein the product calculation circuitry further comprises:
a plurality of parallel shift registers, wherein each of the plurality of shift registers has fixed feedback connections, and wherein an input sequence of $\Lambda(i)$ is split onto t subsequences $\Lambda_h(i)$, $0 \leq h < t$, corresponding to t circulants of H, each of the subsequences being entered into a different one of the plurality of shift registers 350 in parallel, each of the shift registers providing as an output a vector of partial products corresponding to different circulant sub-matrices of the parity check matrix H; and
a plurality of multiplication elements each receiving as inputs the vectors of partial products from each of the plurality of parallel shift registers and providing as an output a corresponding one of the products X(i).

8. The communication system of claim 1, wherein the decoder further comprises:
conversion circuitry which receives a stack of i log-likelihood ratios $\lambda(i,j)$ for the $j^{th}$ bit $u_j$ of the code word and converts the stack of log-likelihood ratios into a stack V(i,j) of real numbers;
summation calculation circuitry coupled to the conversion circuitry which generates for each row of the parity check matrix H a summation W(i) from the stack V(i,j) of real numbers, wherein the summation W(i) is determinable using a relationship approximately of the form $$W(i) = \sum_{j \in C(i)} V(i, j);$$

and
correction generating circuitry coupled to the conversion circuitry and the summation calculation circuitry which generates the corrections $\mu$ by generating each correction value $\mu(i,j)$ of a stack of correction values using corresponding summations W(i) and real numbers according to a relationship approximately of the form $$\mu(i, j) = \log \frac{1 - Y(i, j)}{1 + Y(i, j)},$$

where Y(i,j) is approximately of the form Y(i,j)=exp(W(i)−V(j)).

9. The communication system of claim 1, wherein the channel detector and the low density parity check code decoder are components of a data storage system.

10. A method of decoding data which is encoded with a linear low density parity check code having a parity check matrix H constructed from circulants, the method comprising:
generating log-likelihood ratios with a channel detector, each log-likelihood ratio being indicative of a probability that a transmitted bit u of a code word is equal to 1;
converting the log-likelihood ratios $\lambda$ into real numbers using a low density parity check code decoder;
generating, using the low density parity check code decoder, corrections $\mu$ to the log-likelihood ratios $\lambda$;
generating, using the low density parity check code decoder, corrected log-likelihood ratios $\lambda'$ as a function of the log-likelihood ratios $\lambda$ and the corrections $\mu$; and
providing a binary signal as an output of the low density parity check code decoder.

11. The method of claim 10, wherein converting the log-likelihood ratios $\lambda$ into real numbers using the low density parity check code decoder further comprises converting a stack of i log-likelihood ratios $\lambda(i,j)$ for the $j^{th}$ bit $u_j$ of the code word into a stack $\Lambda(i,j)$ of real numbers.

12. The method of claim 11, and further comprising generating, for each row of the parity check matrix H, a product X(i) from the real numbers, where X(i) is approximately of the form
X(i)=$\Pi_{j \in C(i)} \Lambda(i,j)$, $0 \leq i < M$, where C(i) is approximately of the form C(i)=$\{j:h_{i,j}=1, 1 \leq j \leq N\}$, and where $h_{i,j}$ is an element of i-th row and j-th column of the parity check matrix H.

13. The method of claim 12, wherein generating the corrected log-likelihood ratios $\lambda'$ as a function of the log-likelihood ratios λ and the corrections μ further comprises generating the corrections μ by generating each correction value μ(i,j) of a stack of correction values using corresponding values from the stack Λ(i,j) of real numbers and using the corresponding product X(i) from the real numbers using a relationship approximately of the form $$\mu(i, j) = \log\frac{1 - Y(i, j)}{1 + Y(i, j)},$$

where Y(i,j) is approximately of the form Y(i,j)=X(i)/Λ(i,j).

14. The method of claim 13, wherein converting the log-likelihood ratios λ into real numbers further comprises calculating a new $j^{th}$ input stack λ(i,j) using a relationship approximately of the form $$\lambda(i, j) = \lambda(j) + \sum_{i \in B(j)\backslash i} \mu(i, j),$$

where the $j^{th}$ set B(j) includes the numbers of all parity checks of the low density parity check code that contain the $j^{th}$ code bit, and wherein set B(j)\i is the $j^{th}$ set B(j) without the element i, and wherein $1 \leq i \leq k$, $1 \leq j \leq N$.

15. A communication system for decoding data which is encoded with a linear low density parity check code having a parity check matrix H constructed from circulants, the communication system comprising: a channel detector which provides as an output log-likelihood ratios, each log-likelihood ratio being indicative of a probability that a transmitted bit u of a code word is equal to 1; and decoding means for receiving the log-likelihood ratios λ as an input and for providing as an output a binary signal.

16. The communication system of claim 15, wherein the decoding means further comprises:

conversion circuitry which receives a stack of i log-likelihood ratios λ(i,j) for the $j^{th}$ bit $u_j$ of the code word and converts the stack of log-likelihood ratios into a stack Λ(i,j) of real numbers;

product calculation circuitry coupled to the conversion circuitry which generates for each row of the parity check matrix H a product X(i) from the real numbers, where X(i) approximately of the form X(i)=$\Pi_{j \in C(i)}$Λ(i, j), $0 \leq i < M$, where C(i) is approximately of the form C(i)={j:$h_{i,j}$=1, $1 \leq j \leq N$}, and where $h_{i,j}$ is an element of i-th row and j-th column of the parity check matrix H; and correction generating circuitry coupled to the conversion circuitry and the product calculation circuitry which generates log-likelihood ratio corrections μ by generating each correction value μ(i,j) of a stack of correction values using corresponding values from the stack Λ(i,j) of real numbers and using the corresponding product X(i) from the real numbers using a relationship substantially of the form $$\mu(i, j) = \log\frac{1 - Y(i, j)}{1 + Y(i, j)},$$

where Y(i,j) is substantially of the form Y(i,j)=X(i)/Λ(i,j).

17. The communication system of claim 16, wherein the decoding means further comprises log likelihood ratio stack generating circuitry coupled to the conversion circuitry and to the correction generating circuitry, the log likelihood ratio stack generating circuitry calculating a new $j^{th}$ input stack λ(i,j) using a relationship substantially of the form $$\lambda(i, j) = \lambda(j) + \sum_{i \in B(j)\backslash i} \mu(i, j),$$

where the $j^{th}$ set B(j) includes the numbers of all parity checks of the low density parity check code that contain the $j^{th}$ code bit, and wherein set B(j)\i is the $j^{th}$ set B(j) without the element i, and wherein $1 \leq i \leq k$, $1 \leq j \leq N$.

18. The communication system of claim 17, wherein the product calculation circuitry further comprises:

an input bus carrying the stack Λ(i,j) of real numbers;

a memory device storing a plurality of control vectors, with each of the plurality of control vectors corresponding to a first column of one of the circulant sub-matrices of the parity check matrix H;

a first set of switches coupled to the memory device and being controlled by one of the plurality of control vectors at a time, each of the first set of switches having inputs coupled to the input bus and having an output; and a shift register including a plurality of delay elements and a plurality of multiplication elements, a first input of each multiplication element being coupled to an output of a first corresponding delay element, a second input of each multiplication element being coupled to the output of a corresponding one of the first set of switches, an output of each multiplication element being coupled to an input of a second corresponding delay element, wherein the product X(i) from the real numbers is provided by the delay elements.

19. The communications system of claim 17, wherein the product calculation circuitry further comprises:

a plurality of parallel shift registers, wherein each of the plurality of shift registers has fixed feedback connections, and wherein an input sequence of Λ(i) is split onto t subsequences $\Lambda_h$(i), $0 \leq h < t$, corresponding to t circulants of H, each of the subsequences being entered into a different one of the plurality of shift registers in parallel, each of the shift registers providing as an output a vector of partial products corresponding to different circulant sub-matrices of the parity check matrix H; and a multiplication element receiving as inputs the vectors of partial products from each of the plurality of parallel shift registers and sequentially providing as an output the products X(i).

20. The communications system of claim 17, wherein the product calculation circuitry further comprises:

a plurality of parallel shift registers, wherein each of the plurality of shift registers has fixed feedback connections, and wherein an input sequence of Λ(i) is split onto t subsequences $\Lambda_h$(i), $0 \leq h < t$, corresponding to t circulants of H, each of the subsequences being entered into a different one of the plurality of shift registers in parallel, each of the shift registers providing as an output a vector of partial products corresponding to different circulant sub-matrices of the parity check matrix H; and a plurality of multiplication elements each receiving as inputs the vectors of partial products from each of the plurality of parallel shift registers and providing as an output a corresponding one of the products X(i).

\* \* \* \* \*